(12) United States Patent
Miwa

(10) Patent No.: US 11,508,600 B2
(45) Date of Patent: Nov. 22, 2022

(54) HOLDING DEVICE

(71) Applicant: NGK SPARK PLUG CO., LTD., Nagoya (JP)

(72) Inventor: Kaname Miwa, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 488 days.

(21) Appl. No.: 16/603,631

(22) PCT Filed: Apr. 6, 2018

(86) PCT No.: PCT/JP2018/014687
§ 371 (c)(1),
(2) Date: Oct. 8, 2019

(87) PCT Pub. No.: WO2018/190257
PCT Pub. Date: Oct. 18, 2018

(65) Prior Publication Data
US 2021/0090930 A1    Mar. 25, 2021

(30) Foreign Application Priority Data

Apr. 10, 2017   (JP) .............................. JP2017-077401

(51) Int. Cl.
*H01L 21/683*    (2006.01)
*H01L 21/67*    (2006.01)
(Continued)

(52) U.S. Cl.
CPC .... *H01L 21/6833* (2013.01); *H01L 21/67248* (2013.01); *H01L 21/683* (2013.01);
(Continued)

(58) Field of Classification Search
CPC . H01L 21/683; H01L 21/67; H01L 21/67248; H01L 21/67103; H01L 21/6833;
(Continued)

(56) References Cited

U.S. PATENT DOCUMENTS

2013/0319762 A1* 12/2013 Harris .................. C04B 37/001
156/60
2014/0197151 A1* 7/2014 Volfovski ............. H05B 1/0233
219/448.11
(Continued)

FOREIGN PATENT DOCUMENTS

JP    2008-243990 A    10/2008

OTHER PUBLICATIONS

International Search Report (PCT/ISA/210), issued by International Searching Authority in corresponding International Application No. PCT/JP2018/014687, dated Jul. 10, 2018.

*Primary Examiner* — Danny Nguyen
(74) *Attorney, Agent, or Firm* — Sughrue Mion, PLLC

(57) ABSTRACT

A holding device includes: a plate-shaped member having a first surface approximately orthogonal to a first direction; heat generating resistors and temperature measuring resistors disposed in respective segments formed by virtually dividing at least part of the plate-shaped member, the segments being arranged in a direction orthogonal to the first direction; and an electricity supply section that forms electricity supply paths for the heat generating resistors and the temperature measuring resistors. The holding device holds an object on the first surface of the plate-shaped member. The position of the temperature measuring resistors in the first direction differs from the position of the heat generating resistors in the first direction. A specific temperature measuring resistor that is at least one of the temperature measuring resistors includes a plurality of resistor elements disposed at different positions in the first direction and connected to one another in series.

8 Claims, 12 Drawing Sheets

(51) Int. Cl.
*H05B 1/02* (2006.01)
*H05B 3/28* (2006.01)

(52) U.S. Cl.
CPC ........... *H05B 1/0233* (2013.01); *H05B 3/283* (2013.01); *H05B 2213/07* (2013.01)

(58) Field of Classification Search
CPC ........ H05B 1/02; H05B 3/283; H05B 1/0233; H05B 1/0294; H05B 3/26
USPC ....................................................... 361/234
See application file for complete search history.

(56) References Cited

U.S. PATENT DOCUMENTS

2017/0098564 A1* 4/2017 Pape .................... H01L 21/6833
2017/0215230 A1* 7/2017 Parkhe .................. H01L 21/324

\* cited by examiner

HOLDING DEVICE

CROSS REFERENCE TO RELATED APPLICATIONS

This application is a National Stage of International Application No. PCT/JP2018/014687 filed Apr. 6, 2018, claiming priority based on Japanese Patent Application No. 2017-077401 filed Apr. 10, 2017.

TECHNICAL FIELD

The technique disclosed in the present description relates to a holding device for holding an object.

BACKGROUND ART

For example, an electrostatic chuck is used as a holding device for holding a wafer during manufacturing of a semiconductor. The electrostatic chuck includes a ceramic plate and a chuck electrode disposed inside the ceramic plate and utilizes electrostatic attraction generated when a voltage is applied to the chuck electrode to thereby attract and hold the wafer on a surface of the ceramic plate (the surface is hereinafter referred to as an "attracting surface").

When the temperature distribution in the wafer held on the attracting surface of the electrostatic chuck is nonuniform, the precision of processing (film deposition, etching, etc.) performed on the wafer may decrease. Therefore, the electrostatic chuck needs to have the ability to make the temperature distribution in the wafer as uniform as possible. For this reason, for example, a heat generating resistor is disposed inside the ceramic plate. When a voltage is applied to the heat generating resistor, the heat generating resistor generates heat. The ceramic plate is thereby heated, and the wafer held on the attracting surface of the ceramic plate is also heated. By controlling the voltage applied to the heat generating resistor based on the temperature measured by a temperature sensor (such as thermocouple) disposed inside the ceramic plate, the temperature of the attracting surface of the ceramic plate (i.e., the temperature of the wafer) is controlled.

One structure used to further improve the uniformity of the temperature distribution in the wafer includes a ceramic plate partially or entirely divided into a plurality of virtual regions (hereinafter referred to as "segments") and heat generating resistors disposed in their respective segments. With this structure, by individually controlling the voltages applied to the heat generating resistors disposed in the segments of the ceramic plate, the temperatures of the segments can be controlled individually, so that the uniformity of the temperature distribution on the attracting surface of the ceramic plate (i.e., the uniformity of the temperature distribution in the wafer) can be further improved.

In the structure in which the ceramic plate is virtually divided into the plurality of segments, it is difficult to provide temperature sensors for the respective segments. One known technique to address this issue is to provide temperature measuring resistors different from the heat generating resistors for the respective segments of the ceramic plate (see, for example, Patent Document 1). The resistance value of each temperature measuring resistor changes as the temperature changes. Therefore, by measuring the resistance values of the temperature measuring resistors, the temperatures of the segments in which the temperature measuring resistors are disposed can be measured.

PRIOR ART DOCUMENT

Patent Document

Patent Document 1: Japanese Patent Application Laid-Open (kokai) No. 2008-243990

SUMMARY OF THE INVENTION

Problems to be Solved by the Invention

However, in the conventional technique in which the temperature measuring resistors are disposed in the respective segments of the ceramic plate, the resolution (sensitivity) of the temperature measurement based on the resistance values of the temperature measuring resistors is insufficient. For this and other reasons, there is room for improvement in the accuracy of the measurement of the temperature of each segment, and there is also room for improvement in the uniformity of the temperature distribution on the attracting surface of the ceramic plate (the uniformity of the temperature distribution in the wafer).

The above problem is not a problem peculiar to an electrostatic chuck that holds a water using electrostatic attraction and is a problem common among holding devices each including a plate-shaped member and holding an object on the surface of the plate-shaped member.

The present description discloses a technique capable of solving the above problem.

Means for Solving the Problems

The technique disclosed in the present description can be embodied, for example, in the following modes.

(1) A holding device disclosed in the present description comprises: a plate-shaped member having a first surface approximately orthogonal to a first direction; heat generating resistors disposed in respective segments formed by virtually dividing at least part of the plate-shaped member, the segments being arranged in a direction orthogonal to the first direction; temperature measuring resistors disposed in the respective segments and located at a position in the first direction different from that of the heat generating resistors; and an electricity supply section that forms electricity supply paths for the heat generating resistors and the temperature measuring resistors, the holding device being adapted to hold an object on the first surface of the plate-shaped member, wherein a specific temperature measuring resistor that is at least one of the temperature measuring resistors includes a plurality of resistor elements disposed at different positions in the first direction and connected to one another in series. In the present holding device, while the specific temperature measuring resistor that is at least one of the temperature measuring resistors is disposed within one segment, the resistance value of the specific temperature measuring resistor can be higher than the resistance value of a temperature measuring resistor having a single layer structure. When the resistance value of the specific temperature measuring resistor is high, the resolution (sensitivity) of temperature measurement based on the resistance value of the specific temperature measuring resistor is improved. In the present holding device, since the resolution of the temperature measurement based on the resistance value of the specific temperature measuring resistor can be improved, the accuracy of the measurement of the temperature of the segment in which the specific temperature measuring resistor is disposed can be improved, and the accuracy in controlling the temperature of this segment using the heat generating resistor disposed in the segment can be improved. Therefore, the uniformity of the temperature distribution on the first surface of the plate-shaped member (i.e., the uniformity of the temperature distribution in an object held on the first surface) can be improved.

(2) In the above-described holding device, the electricity supply section may include: a driver including a line pair composed of a first conductive line and a second conductive line; a pair of electricity supply terminals; an electricity supply-side via pair including a first electricity supply-side via and a second electricity supply-side via, the first electricity supply-side via electrically connecting the first conductive line of the line pair to one of the electricity supply terminals, the second electricity supply-side via electrically connecting the second conductive line of the line pair to the other of the electricity supply terminals; and a resistor-side via pair including a first resistor-side via and a second resistor-side via, the first resistor-side via electrically connecting one end of one of the temperature measuring resistors to the first conductive line of the line pair, the second resistor-side via electrically connecting the other end of the one of the temperature measuring resistors to the second conductive line of the line pair, wherein at least one of the first conductive line and the second conductive line of the line pair that is electrically connected to the specific temperature measuring resistor includes a plurality of conductive line elements disposed at different positions in the first direction and connected in parallel to each other. In the present holding device, the resistance values of the conductive lines of the line pair included in the driver can be reduced relatively with respect to the resistance value of the specific temperature measuring resistor, and the resistance value of the specific temperature measuring resistor can be increased relatively with respect to the resistance values of the conductive lines. Therefore, in the present holding device, since the resolution of the temperature measurement based on the resistance value of the specific temperature measuring resistor can be improved, the accuracy of the measurement of the temperature of the segment in which the specific temperature measuring resistor is disposed can be improved, and the uniformity of the temperature distribution on the first surface of the plate-shaped member (i.e., the uniformity of the temperature distribution in the object held on the first surface) can thereby be improved. In the present holding device, since the resistance values of the conductive lines of the line pair included in the driver can be reduced relatively, the ratio of the resistance value of the line pair (that is influenced by the temperatures of other segments) to the resistance value of an electric circuit including the specific temperature measuring resistor and the line pair can be reduced. Therefore, in the present holding device, the accuracy of the measurement of the temperature of the above segment using the specific temperature measuring resistor can be effectively improved, so that the uniformity of the temperature distribution on the first surface of the plate-shaped member (i.e., the uniformity of the temperature distribution in the object held on the first surface) can be effectively improved.

(3) In the above-described holding device, the electricity supply section may include: a driver including a plurality of first conductive lines and a plurality of second conductive lines; at least one pair of electricity supply terminals; an electricity supply-side via pair including a first electricity supply-side via and a second electricity supply-side via, the first electricity supply-side via electrically connecting the plurality of first conductive lines to one of the pair of electricity supply terminals, the second electricity supply-side via electrically connecting the plurality of second conductive lines to the other of the pair of electricity supply terminals; and resistor-side via pairs that electrically connect the respective temperature measuring resistors to the respective first conductive lines and the respective second conductive lines, wherein each of the first conductive lines is electrically connected to some of the plurality of temperature measuring resistors, and each of the second conductive lines is electrically connected to some of the plurality of temperature measuring resistors, and wherein the temperature measuring resistors differ from one another in terms of a combination of the first conductive line and the second conductive line electrically connected to each of the temperature measuring resistor. In the present holding device, the individual electricity supply paths to the temperature measuring resistors can be formed using a relatively small number of conductive lines. Therefore, by making the line widths of the conductive lines relatively wide, the resistance value of each conductive line can be reduced relatively with respect to the resistance value of the temperature measuring resistor, and the resistance value of the temperature measuring resistor can be increased relatively with respect to the resistance value of each conductive line. Therefore, in the present holding device, since the resolution of the temperature measurement based on the resistance values of the temperature measuring resistors can be improved, the accuracy of the measurement of the temperatures of the segments of the plate-shaped member can be improved, and the uniformity of the temperature distribution on the first surface of the plate-shaped member (i.e., the uniformity of the temperature distribution in the object held on the first surface) can thereby be improved. In the present holding device, since the resistance values of the conductive lines of the line pairs included in the driver can be reduced relatively, the ratio of the resistance value of the line pair (that is influenced by the temperatures of other segments) to the resistance value of an electric circuit including a corresponding temperature measuring resistor and the line pair can be reduced. Therefore, in the present holding device, the accuracy of the measurement of the temperatures of the segments using the temperature measuring resistors can be effectively improved, so that the uniformity of the temperature distribution on the first surface of the plate-shaped member (i.e., the uniformity of the temperature distribution in the object held on the first surface) can be effectively improved.

(4) The above-described holding device may further comprise a base member that includes a coolant channel formed therein and is disposed on a surface of the plate-shaped member that is opposite to the first surface, wherein the specific temperature measuring resistor is disposed at a position closer to the base member than a corresponding heat generating resistor that is disposed in a segment in which the specific temperature measuring resistor is disposed. In the present holding device, since the specific temperature measuring resistor is disposed between the corresponding heat generating resistor for heating and the coolant channel for cooling with respect to the first direction, the accuracy of the measurement of the temperature of the above segment using the specific temperature measuring resistor can be further improved, so that the uniformity of the temperature distribution on the first surface of the plate-shaped member (i.e., the uniformity of the temperature distribution in the object held on the first surface) can be further improved.

(5) In the above-described holding device, the electricity supply section may include: a driver including a line pair composed of a first conductive line and a second conductive line; a pair of electricity supply terminals; an electricity supply-side via pair including a first electricity supply-side via and a second electricity supply-side via, the first electricity supply-side via electrically connecting the first conductive line of the line pair to one of the electricity supply terminals, the second electricity supply-side via electrically connecting the second conductive line of the line pair to the other of the electricity supply terminals; and a resistor-side via pair including a first resistor-side via and a second resistor-side via, the first resistor-side via electrically connecting one end of one of the temperature measuring resistors to the first conductive line of the line pair, the second resistor-side via electrically connecting the other end of the one of the temperature measuring resistors to the second conductive line of the line pair, wherein at least one of the first conductive line and the second conductive line of the line pair connected to the specific temperature measuring resistor has a line width larger than that of the specific temperature measuring resistor. In the present holding device, the resistance value of the line pair can be reduced relatively with respect to the resistance value of the specific temperature measuring resistor, and the resistance value of the specific temperature measuring resistor can be increased relatively with respect to the resistance value of the line pair. In the present holding device, since the resistance value of the specific temperature measuring resistor can be increased relatively, the resolution (sensitivity) of the temperature measurement based on the resistance value of the specific temperature measuring resistor can be improved, and the accuracy of the measurement of the temperature of the segment in which the specific temperature measuring resistor is disposed can be improved, so that the uniformity of the temperature distribution on the first surface of the ceramic plate (i.e., the uniformity of the temperature distribution in the object held on the first surface) can be improved. In the present holding device, since the resistance value of the line pair included in the deriver can be reduced relatively, the ratio of the resistance value of the line pair (that is influenced by the temperatures of other segments) to the resistance value of an electric circuit including the specific temperature measuring resistor and the line pair can be reduced. Therefore, in the present holding device, the accuracy of the measurement of the temperature of the above segment using the specific temperature measuring resistor can be improved, so that the uniformity of the temperature distribution on the first surface of the ceramic plate (i.e., the uniformity of the temperature distribution in the object held on the first surface) can be improved.

(6) In the above-described holding device, the conductive lines included in the driver may include a conductive line having a length L1 in an extending direction and a line width W1; and a conductive line having a length L2 (L2>L1) in the extending direction and a line width W2 (W2>W1). In the present holding device, the conductive lines included in the driver can have close resistance values, and the variation of the ratios of the resistance values of the conductive lines to the resistance values of electric circuits including the temperature measuring resistors and the conductive lines can be reduced. Therefore, in the present holding device, the accuracy of the measurement of the temperatures of the segments using the temperature measuring resistors can be effectively improved, so that the uniformity of the temperature distribution on the first surface of the plate-shaped member (i.e., the uniformity of the temperature distribution in the object held on the first surface) can be effectively improved.

(7) In the above-described holding device, when the specific temperature measuring resistor and a corresponding heat generating resistor disposed in a segment in which the specific temperature measuring resistor is disposed are projected onto an arbitrary virtual plane parallel to the first direction, positions of opposite ends of the projection of the specific temperature measuring resistor may be located between opposite ends of the projection of the heat generating resistor, as viewed in a second direction parallel to the virtual plane and orthogonal to the first direction. In the present holding device, when viewed in the first direction, the specific temperature measuring resistor can be disposed to be located more inward in the segment in which the specific temperature measuring resistor is disposed (i.e., located farther apart from the boundary of the segment) as compared with the heat generating resistor disposed in the segment in which the specific temperature measuring resistor is disposed. Therefore, in the present holding device, since the temperature (resistance value) of the specific temperature measuring resistor disposed in a certain segment is prevented from being influenced by the temperatures of other segments, the accuracy of the measurement of the temperature of the certain segment using the specific temperature measuring resistor can be improved, so that the uniformity of the temperature distribution on the first surface of the plate-shaped member (i.e., the uniformity of the temperature distribution in the object held on the first surface) can be improved.

(8) In the above-described holding device, a heat insulating layer having a lower thermal conductivity than the plate-shaped member may be disposed within the plate-shaped member to be located between the specific temperature measuring resistor and others of the temperature measuring resistors. In the present holding device, the temperature (resistance value) of the specific temperature measuring resistor disposed in a certain segment can be effectively prevented from being influenced by the temperatures of other segments. Therefore, in the present holding device, the accuracy of the measurement of the temperature of the certain segment using the specific temperature measuring resistor can be effectively improved, and the uniformity of the temperature distribution on the first surface of the ceramic plate (i.e., the uniformity of the temperature distribution in the object held on the first surface) can be effectively improved.

The technique disclosed in the present description can be embodied in various forms such as a holding device, an electrostatic chuck, a heating device such as a CVD heater, a vacuum chuck, and methods for producing these devices.

MODES FOR CARRYING OUT THE INVENTION

A. First Embodiment

A-1. Structure of Electrostatic Chuck 100

Figure 1:
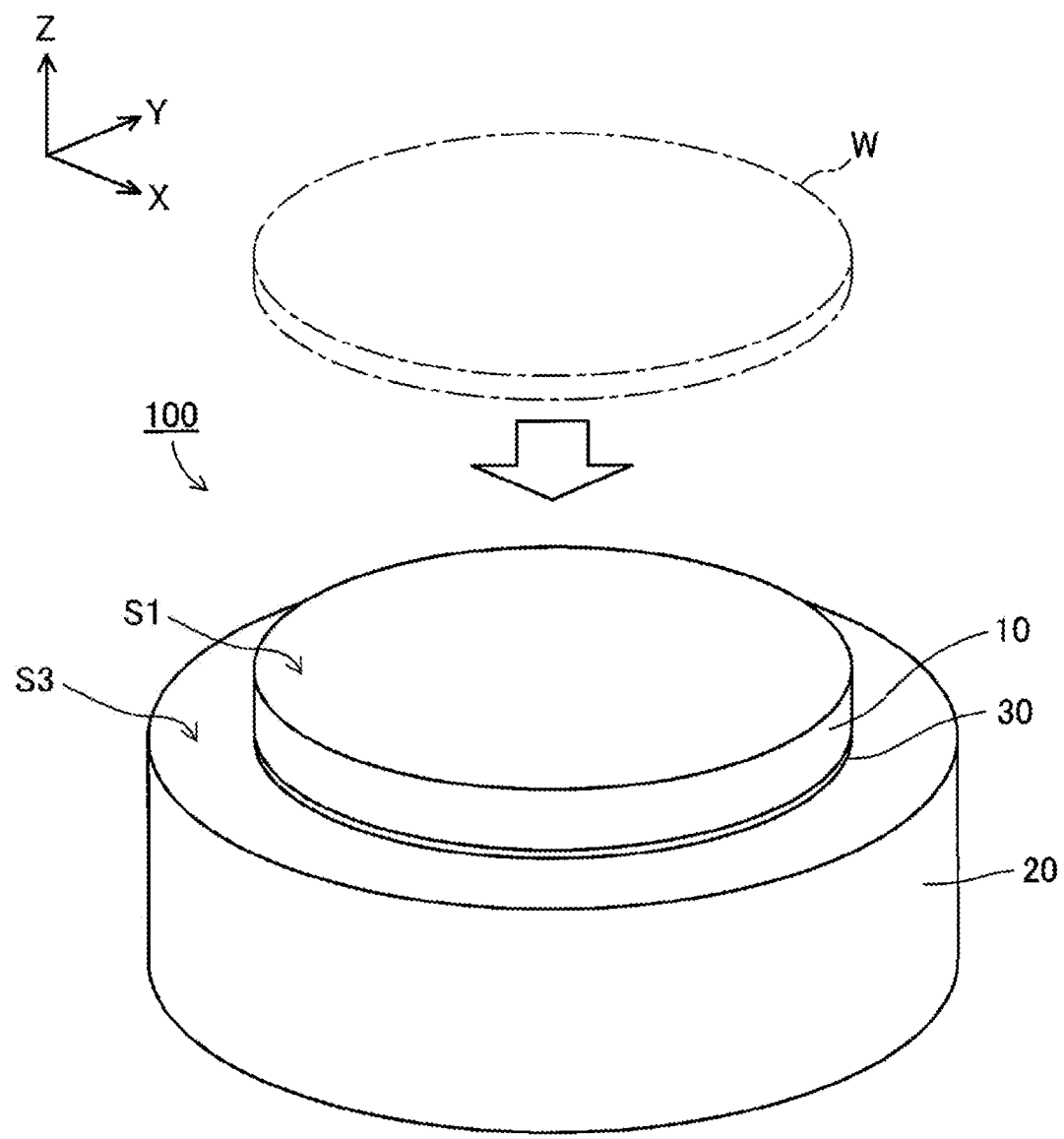
FIG. 1 is a perspective view schematically showing an external structure of an electrostatic chuck 100 according to a first embodiment.
Figure 2:
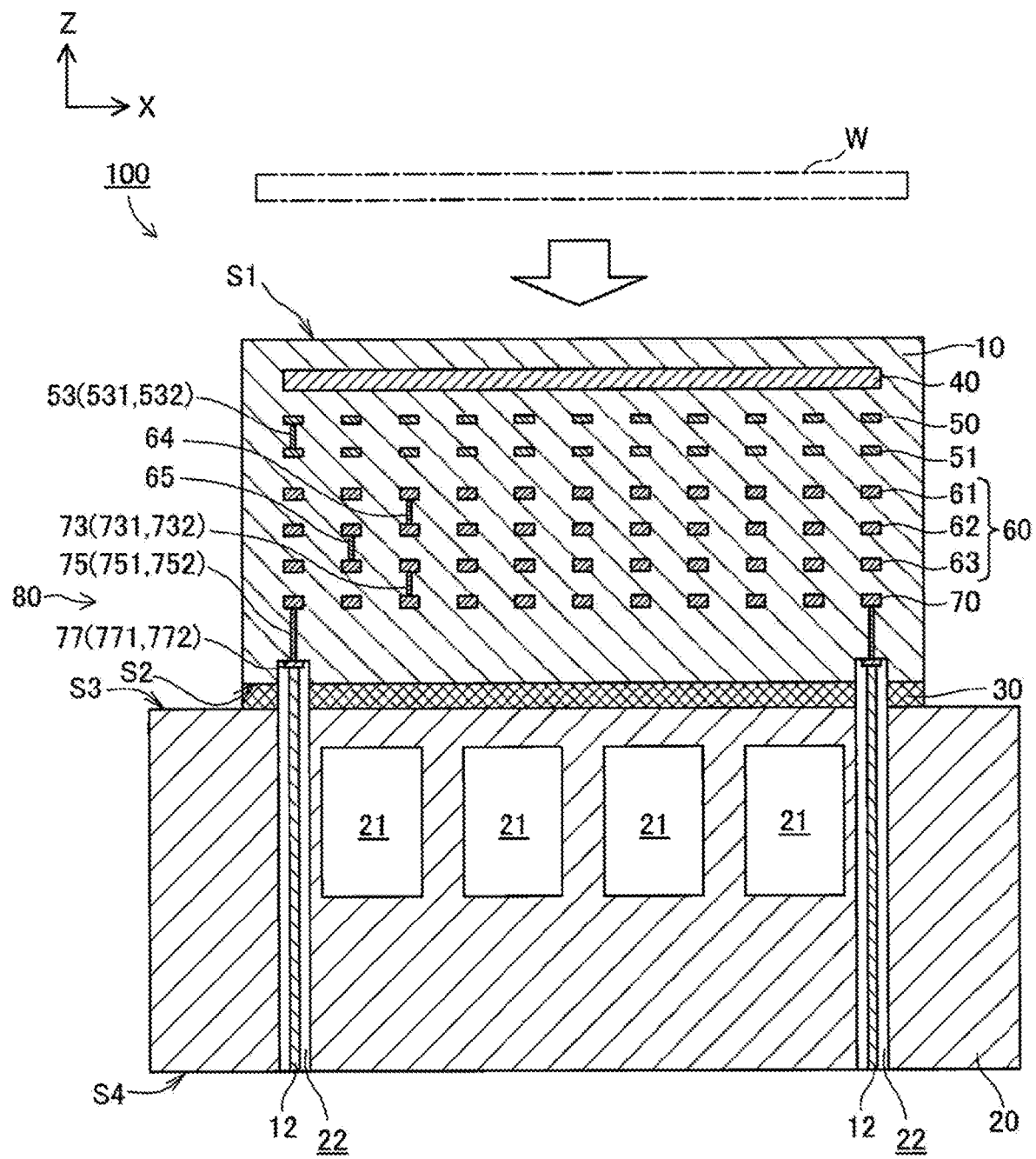
FIG. 2 is an illustration schematically showing an XZ cross-sectional structure of the electrostatic chuck 100 according to the first embodiment.
Figure 3:
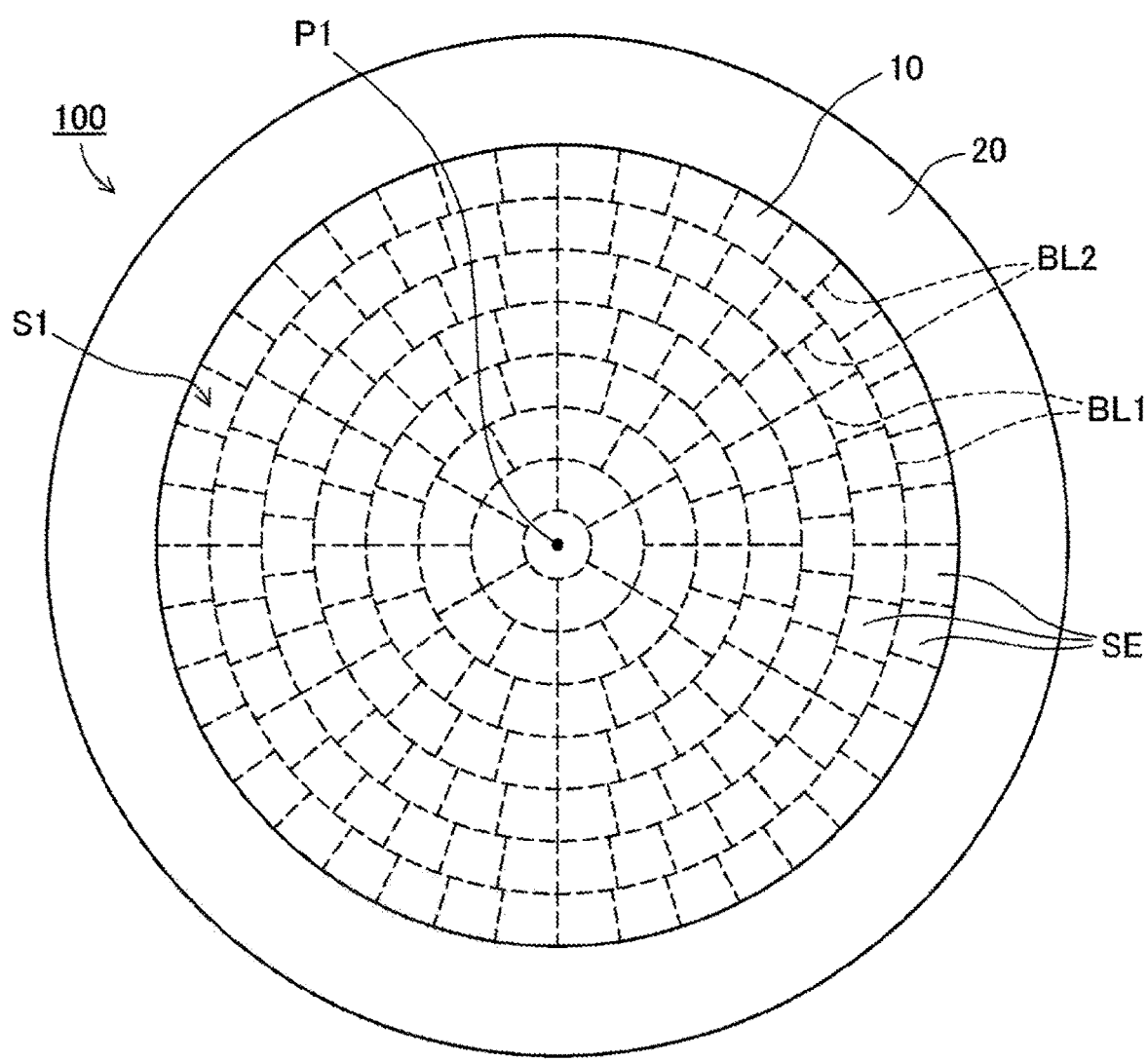
FIG. 3 is an illustration schematically showing an XY plane structure of the electrostatic chuck 100 according to the first embodiment.

FIG. 1 is a perspective view schematically showing an external structure of an electrostatic chuck 100 according to a first embodiment, and FIG. 2 is an illustration schematically showing an XZ cross-sectional structure of the electrostatic chuck 100 according to the first embodiment. FIG. 3 is an illustration schematically showing an XY plane (upper surface) structure of the electrostatic chuck 100 according to the first embodiment. Mutually orthogonal X, Y, and Z axes for designating directions are shown in these figures. In the present description, a positive Z-axis direction is referred to as an upward direction, and a negative Z-axis direction is referred to as a downward direction, for the sake of convenience. However, in actuality, the electrostatic chuck 100 may be oriented differently.

The electrostatic chuck 100 is a device that attracts and holds an object (e.g., a wafer W) by electrostatic attraction and is used to fix the wafer W, for example, in a vacuum chamber of a semiconductor manufacturing apparatus. The electrostatic chuck 100 includes a ceramic plate 10 and a base member 20 that are arranged in a prescribed arrangement direction (the vertical direction (the Z axis direction) in the present embodiment). The ceramic plate 10 and the base member 20 are arranged such that the lower surface S2 of the ceramic plate 10 (see FIG. 2) and the upper surface S3 of the base member 20 face each other in the above-mentioned arrangement direction.

The ceramic plate 10 is a plate-shaped member having an approximately circular flat upper surface S1 (hereinafter referred to as an "attracting surface") approximately orthogonal to the above-mentioned arrangement direction (the Z axis direction) and is formed of a ceramic (such as alumina or aluminum nitride). The diameter of the ceramic plate 10 is, for example, about 50 mm to about 500 mm (generally about 200 mm to about 350 mm), and the thickness of the ceramic plate 10 is, for example, about 1 mm to about 10 mm. The attracting surface S1 of the ceramic plate 10 corresponds to the first surface in the claims, and the Z axis direction corresponds to the first direction in the claims. In the present description, a direction orthogonal to the Z axis direction is referred to as a "plane direction."

As shown in FIG. 2, a chuck electrode 40 formed of an electrically conductive material (such as tungsten, molybdenum, or platinum) is disposed inside the ceramic plate 10. As viewed in the Z axis direction, the chuck electrode 40 has, for example, an approximately circular shape. When a voltage is applied from a power source (not shown) to the chuck electrode 40, electrostatic attraction is generated, and the wafer W is attracted and fixed to the attracting surface S1 of the ceramic plate 10 through the electrostatic attraction.

A heat generating resistor layer 50, a heat generating resistor driver 51, a temperature measuring resistor layer 60, a temperature measuring resistor driver 70, and vias are disposed inside the ceramic plate 10. Each of the heat generating resistor layer 50, the heat generating resistor driver 51, the temperature measuring resistor layer 60, the temperature measuring resistor driver 70, and the vias is formed of an electrically conductive material (such as tungsten, molybdenum, or platinum). In the present embodiment, the heat generating resistor layer 50 is disposed below the chuck electrode 40, and the heat generating resistor driver 51 is disposed below the heat generating resistor layer 50. The temperature measuring resistor layer 60 is disposed below the heat generating resistor driver 51, and the temperature measuring resistor driver 70 is disposed below the temperature measuring resistor layer 60. Their structures will be descried later. The ceramic plate 10 having such a structure may be produced as follows. For example, a plurality of ceramic green sheets are produced and subjected to prescribed processing. For example, via holes are formed in prescribed ceramic green sheets, and a metallized paste is printed onto prescribed ceramic green sheets. These ceramic green sheets are thermocompression-bonded, subjected to machining such as cutting, and then fired.

The base member 20 is a circular flat plate-shaped member having, for example, the same diameter as the ceramic plate 10 or a larger diameter than the ceramic plate 10 and is formed, for example, of a metal (aluminum, an aluminum alloy, etc.). The diameter of the base member 20 is, for example, about 220 mm to about 550 mm (generally 220 mm to 350 mm), and the thickness of the base member 20 is, for example, about 20 mm to about 40 mm.

The base member 20 is joined to the ceramic plate 10 through a bonding layer 30 disposed between the lower surface S2 of the ceramic plate 10 and the upper surface S3 of the base member 20. The bonding layer 30 is formed from an adhesive such as a silicone resin, an acrylic resin, or an epoxy resin. The thickness of the bonding layer 30 is, for example, about 0.1 mm to about 1 mm.

A coolant channel 21 is formed inside the base member 20. When a coolant (such as a fluorine-based inert liquid or water) is introduced into the coolant channel 21, the base member 20 is cooled, and the ceramic plate 10 is cooled by heat transfer (heat absorption) between the base member 20 and the ceramic plate 10 through the bonding layer 30. The wafer W held on the attracting surface S1 of the ceramic plate 10 is thereby cooled. This allows the temperature of the wafer W to be controlled.

A-2. Structures of Heat Generating Resistor Layer 50 and Heat Generating Resistor Driver 51

Figure 4:
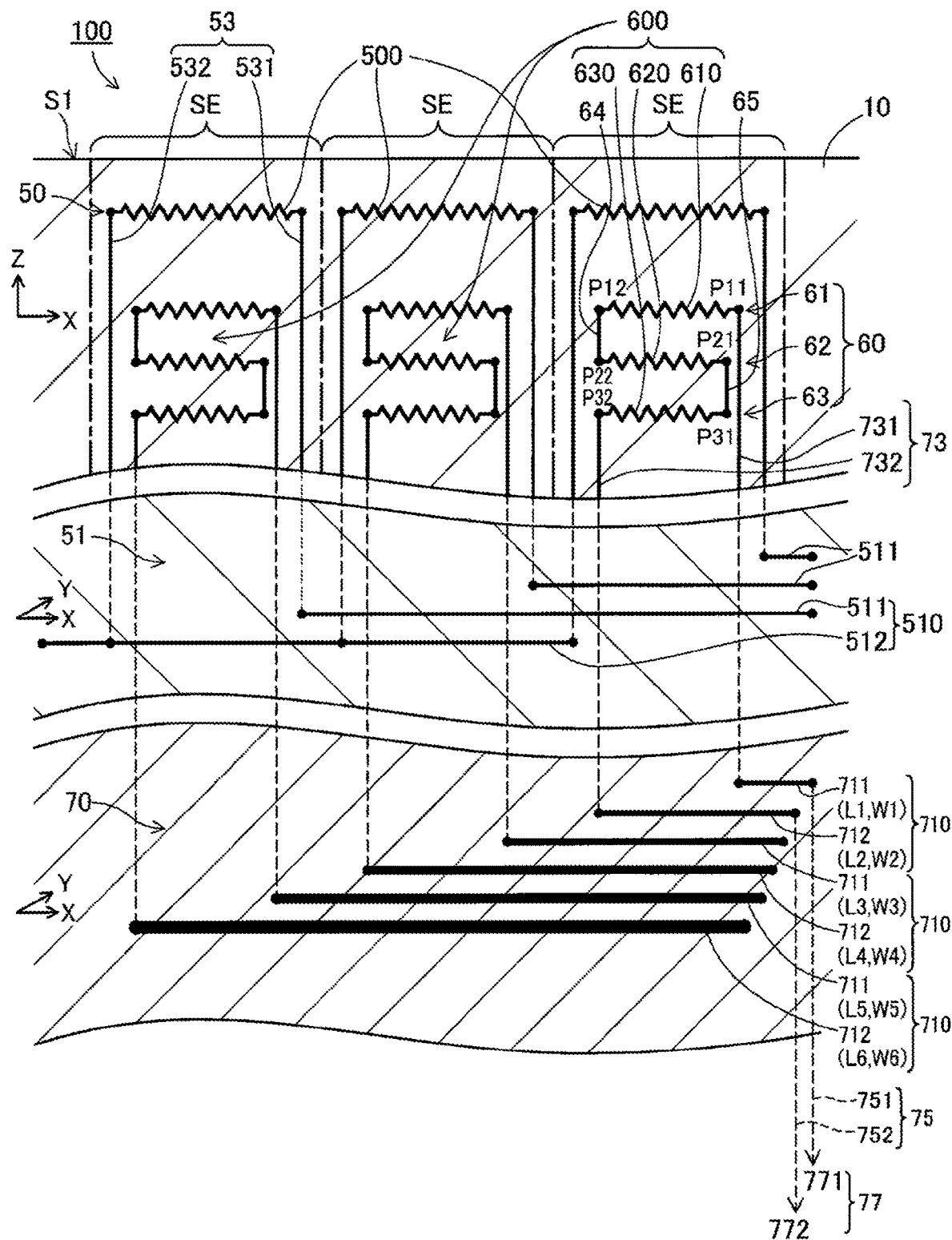
FIG. 4 is an illustration schematically showing structures of a heat generating resistor layer 50, a heat generating resistor driver 51, a temperature measuring resistor layer 60, and a temperature measuring resistor driver 70 of the electrostatic chuck 100 according to the first embodiment.

As described above, the heat generating resistor layer 50 and the heat generating resistor driver 51 are disposed inside the ceramic plate 10 (see FIG. 2). FIG. 4 is an illustration schematically showing the structures of the heat generating resistor layer 50 and the heat generating resistor driver 51 (and the structures of the temperature measuring resistor layer 60 and the temperature measuring resistor driver 70). An XZ cross-sectional structure of part of the heat generating resistor layer 50 is schematically shown in the upper part of FIG. 4, and an XY plane structure of part of the heat generating resistor driver 51 is schematically shown in the middle part of FIG. 4.

As shown in FIG. 3, in the electrostatic chuck 100 of the present embodiment, the ceramic plate 10 is virtually divided into a plurality of segments SE arranged in the plane directions (directions orthogonal to the Z axis direction). More specifically, as viewed in the Z axis direction, the ceramic plate 10 is divided into a plurality of virtual annular regions by a plurality of concentric circular first boundary lines BL1 with their centers at the central point P1 of the attracting surface S1 (note that only a region containing the central point P1 is a circular region). Each annular region is divided by a plurality of second boundary lines BL2 extending in radial directions of the attracting surface S1 into the segments SE that are a plurality of virtual regions arranged in the circumferential direction of the attracting surface S1.

As shown in FIG. 4, the heat generating resistor layer 50 includes a plurality of heat generating resistors 500. Each of the plurality of heat generating resistors 500 is disposed in a corresponding one of the plurality of segments SE provided in the ceramic plate 10. Specifically, in the electrostatic chuck 100 of the present embodiment, one heat generating resistor 500 is disposed in each of the plurality of segments SE.

Figure 5:
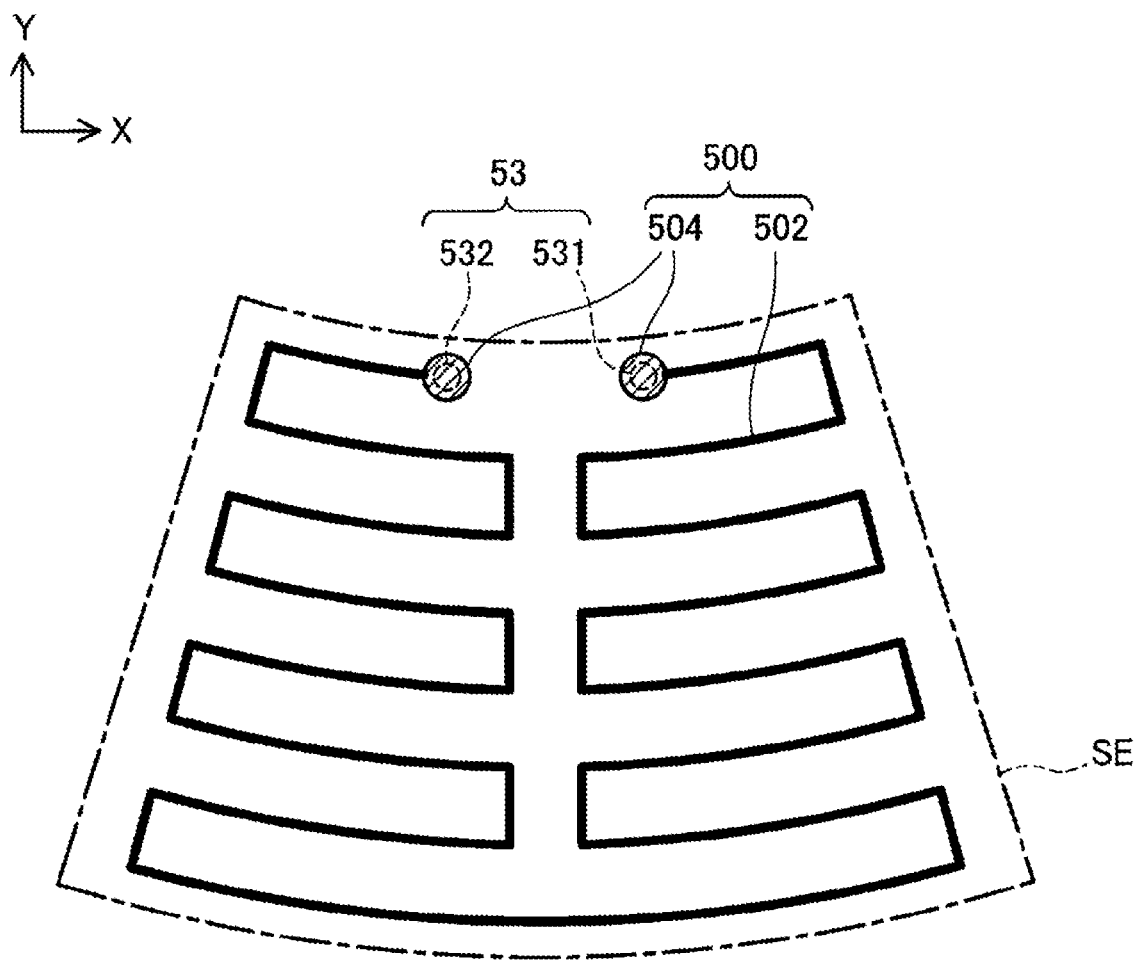
FIG. 5 is an illustration schematically showing an XY cross-sectional structure of one heat generating resistor 500 disposed in one segment SE.

FIG. 5 is an illustration schematically showing an XY cross-sectional structure of one heat generating resistor 500 disposed in one segment SE. As shown in FIG. 5, the heat generating resistor 500 includes a pair of pads 504 forming opposite ends of the heat generating resistor 500 and a line-shaped resistance wiring portion 502 connecting the pair of pads 504. In the present embodiment, when viewed in the Z axis direction, the resistance wiring portion 502 is formed into a wiring shape that runs all over the segment SE as uniformly as possible. Other heat generating resistors 500 disposed in other segments SE also have the above structure.

The electrostatic chuck 100 has a structure for supplying electricity to the heat generating resistors 500. Specifically, a pair of terminal holes (not shown) are formed in the electrostatic chuck 100, and electricity supply terminals (not shown) are housed in the terminal holes.

The heat generating resistor driver 51 is also part of the structure for supplying electricity to the heat generating resistors 500. As shown in FIG. 4, the heat generating resistor driver 51 includes a plurality of line pairs 510 each including a first conductive line 511 and a second conductive line 512. In the example shown in FIG. 4, the plurality of line pairs 510 share one second conductive line 512. A separate second conductive line 512 may be provided for each line pair 510. Each of the first conductive lines 511 and the second conductive line 512 are electrically connected to different electricity supply terminals through vias (not shown), electrode pads (not shown), etc.

As shown in FIGS. 4 and 5, the first conductive line 511 of each line pair 510 is electrically connected to one end (pad 504) of a corresponding heat generating resistor 500 through one via 531 of a corresponding via pair 53, and the second conductive line 512 of the line pair 510 is electrically connected to the other end (pad 504) of the corresponding heat generating resistor 500 through the other via 532 of the corresponding via pair 53.

When a voltage is applied from a power source (not shown) to the heat generating resistors 500 through the electricity supply terminals, the electrode pads, the vias, the line pairs 510, and the via pairs 53, each heat generating resistor 500 generates heat. The segment SE in which the heat generating resistor 500 is disposed is thereby heated. By individually controlling the voltages applied to the heat generating resistors 500 disposed in the respective segments SE of the ceramic plate 10, the temperatures of the segments SE can be controlled individually.

A-3. Structures of Temperature Measuring Resistor Layer 60 and Temperature Measuring Resistor Driver 70

As described above, the temperature measuring resistor layer 60 and the temperature measuring resistor driver 70 are disposed inside the ceramic plate 10 (see FIG. 2). The XZ cross-sectional structure of part of the temperature measuring resistor layer 60 is schematically shown in the upper part of FIG. 4, and the XY plane structure of part of the temperature measuring resistor driver 70 is schematically shown in the lower part of FIG. 4. The temperature measuring resistor driver 70 corresponds to the driver in the claims.

As shown in FIGS. 2 and 4, the temperature measuring resistor layer 60 is composed of three layers (a first resistor layer 61, a second resistor layer 62, and a third resistor layer 63 disposed from the upper side) disposed at different positions in the Z axis direction. As shown in FIG. 4, the temperature measuring resistor layer 60 composed of the three layers includes a plurality of temperature measuring resistors 600. Each of the plurality of temperature measuring resistors 600 is disposed in a corresponding one of the plurality of segments SE provided in the ceramic plate 10. Specifically, in the electrostatic chuck 100 of the present embodiment, one temperature measuring resistor 600 is disposed in each of the plurality of segments SE. As described above, in the electrostatic chuck 100 of the present embodiment, since the temperature measuring resistor layer 60 is located below the heat generating resistor layer 50, in the respective segments SE, the temperature measuring resistors 600 are located below the heat generating resistors 500 (closer to the base member 20 than the heat generating resistors 500).

Figure 6:
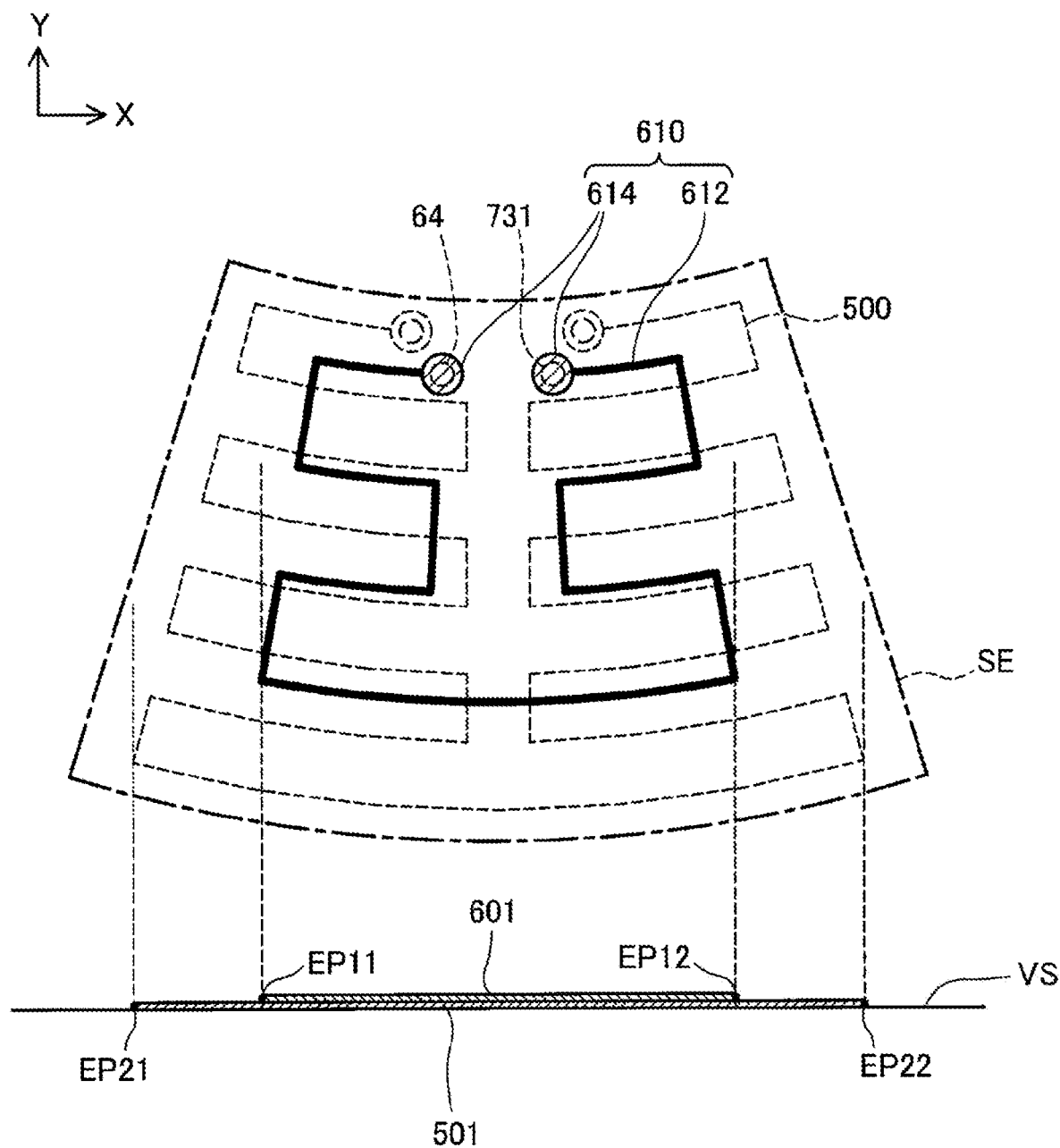
FIG. 6 is an illustration schematically showing an XY cross-sectional structure of a first resistor element 610 forming one temperature measuring resistor 600 disposed in one segment SE.

As shown in FIG. 4, each of the temperature measuring resistors 600 includes a first resistor element 610 included in the first resistor layer 61, a second resistor element 620 included in the second resistor layer 62, and a third resistor element 630 included in the third resistor layer 63. FIG. 6 is an illustration schematically showing an XY cross-sectional structure of a first resistor element 610 forming one temperature measuring resistor 600 disposed in one segment SE. The plane direction position of the heat generating resistor 500 disposed in this segment SE is indicated by a broken line in FIG. 6 for reference purposes. As shown in FIG. 6, the first resistor element 610 includes a pair of pads 614 forming opposite ends of the first resistor element 610 and a line-shaped resistance wiring portion 612 connecting the pair of pads 614. The structures of other resistor elements (the second resistor element 620 and the third resistor element 630) forming the temperature measuring resistor 600 are the same as the structure of the first resistor element 610 shown in FIG. 6. Notably, each of the second resistor element 620 and the third resistor element 630 includes a pair of pads and a line-shaped resistance wiring portion connecting the pair of pads. The positions and shapes of the pads and resistance wiring portions of the second resistor element 620 and the third resistor element 630 are not necessarily the same as the positions and shapes of the pads and resistance wiring portion of the first resistor element 610.

As shown in FIG. 4, one end P12 (i.e., the above-mentioned pad 614) of each first resistor element 610 is electrically connected to one end P22 of a corresponding second resistor element 620 through a via 64. The other end P21 of the second resistor element 620 is electrically connected to one end P31 of a corresponding third resistor element 630 through another via 65. Namely, the three resistor elements (the first resistor element 610, the second resistor element 620, and the third resistor element 630) forming a corresponding temperature measuring resistor 600 are connected in series.

The electrostatic chuck 100 has a structure for supplying electricity to the temperature measuring resistors 600. Specifically, as shown in FIG. 2, a pair of terminal holes 22 extending from the lower surface S4 of the base member 20 to the inside of the ceramic plate 10 are formed in the electrostatic chuck 100, and electricity supply terminals 12 are housed in the terminal holes 22.

The temperature measuring resistor driver 70 is also part of the structure for supplying electricity to the temperature measuring resistors 600. As shown in FIG. 4, the temperature measuring resistor driver 70 includes a plurality of line pairs 710 each composed of a first conductive line 711 and a second conductive line 712. As shown in FIGS. 2 and 4, the first conductive line 711 of each line pair 710 is electrically connected to one of the electricity supply terminals 12 through an electricity supply-side via 751 of a corresponding electricity supply-side via pair 75 and an electrode pad 771 of an electrode pad pair 77. The second conductive line 712 of the line pair 710 is electrically connected to the other one of the electricity supply terminals 12 through an electricity supply-side via 752 of the corresponding electricity supply-side via pair 75 and an electrode pad 772 of the electrode pad pair 77. In FIG. 4, only one electricity supply-side via pair 75 for a corresponding line pair 710 is shown as a representative pair, and illustrations of electricity supply-side via pairs 75 for other line pairs 710 are omitted. The electricity supply-side via 751 corresponds to the first electricity supply-side via in the claims, and the electricity supply-side via 752 corresponds to the second electricity supply-side via in the claims.

As shown in FIGS. 2, 4, and 6, the first conductive line 711 of each line pair 710 is electrically connected to one end of a corresponding temperature measuring resistor 600 (more specifically, a pad 614 serving as one end P11 of the first resistor element 610 of the corresponding temperature measuring resistor 600) through a resistor-side via 731 of a corresponding resistor-side via pair 73. The second conductive line 712 of the line pair 710 is electrically connected to the other end of the corresponding temperature measuring resistor 600 (more specifically, a pad serving as one end P32 of the third resistor element 630 of the corresponding temperature measuring resistor 600) through a resistor-side via 732 of the corresponding resistor-side via pair 73. The resistor-side via 731 corresponds to the first resistor-side via in the claims, and the resistor-side via 732 corresponds to the second resistor-side via in the claims.

When a voltage is applied from a power source (not shown) to the temperature measuring resistors 600 through the pair of electricity supply terminals 12, the electrode pad pair 77, the electricity supply-side via pairs 75, the line pairs 710, and the resistor-side via pairs 73, current flows through the temperature measuring resistors 600. The temperature measuring resistors 600 are formed of an electrically conductive material (such as tungsten, molybdenum, or platinum) whose resistance value changes with temperature. Specifically, the resistance value of each temperature measuring resistor 600 increases as the temperature increases. The electrostatic chuck 100 includes a structure for measuring the voltage applied to each temperature measuring resistor 600 and the current flowing through each temperature measuring resistor 600 (for example, a voltmeter and an ammeter (not shown)). Therefore, in the electrostatic chuck 100 of the present embodiment, the temperatures of the temperature measuring resistors 600 can be measured (determined) based on the measured values of the voltages applied to the temperature measuring resistors 600 and the measured values of the currents flowing through the temperature measuring resistors 600.

By individually measuring the temperatures of the temperature measuring resistors 600 disposed in the ceramic plate 10 using the above-described method, the temperatures of the segments SE of the ceramic plate 10 can be measured individually in real time. Therefore, in the electrostatic chuck 100 of the present embodiment, by individually controlling the voltages applied to the heat generating resistors 500 disposed in the segments SE based on the results of the measurement of the temperatures of the segments SE of the ceramic plate 10, the temperatures of the segments SE can be controlled with high accuracy. In the electrostatic chuck 100 of the present embodiment, the uniformity of the temperature distribution on the attracting surface S1 of the ceramic plate 10 (i.e., the uniformity of the temperature distribution in the wafer W) can be improved. The structures for forming the above-described electricity supply paths for the heat generating resistors 500 and the temperature measuring resistors 600 are correctively referred to as an electricity supply section 80 (see FIG. 2).

FIG. 6 shows a projection 601 of the first resistor element 610 of a temperature measuring resistor 600 and a projection 501 of a heat generating resistor 500 disposed in the segment SE in which the above temperature measuring resistor 600 is disposed, the projection 601 and the projection 501 being obtained by projecting the first resistor element 610 and the heat generating resistor 500 onto a virtual plane VS parallel to the Z axis direction (more specifically, the virtual plane VS parallel to the X axis). As shown in FIG. 6, the positions of opposite ends EP11 and EP12 of the projection 601 of the first resistor element 610 are located between opposite ends EP21 and EP22 of the projection 501 of the heat generating resistor 500. As described above, in the electrostatic chuck 100 of the present embodiment, when each first resistor element 610 and a corresponding heat generating resistor 500 disposed in the segment SE in which this temperature measuring resistor 600 is disposed are projected onto an arbitrary virtual plane VS parallel to the Z axis direction, the positions of the opposite ends of the projection of the first resistor element 610 are located between the opposite ends of the projection of the heat generating resistor 500, as viewed in a direction parallel to the virtual plane VS and orthogonal to the Z axis direction (the X axis direction in the example in FIG. 6).

Similarly, in each of the second resistor element 620 and the third resistor element 630, the positions of opposite ends of the projection of the second resistor element 620 (or the third resistor element 630) are located between opposite ends of the projection of the heat generating resistor 500. Therefore, also as for the temperature measuring resistor 600 composed of the three resistor elements (the first resistor element 610, the second resistor element 620, and the third resistor element 630), when the temperature measuring resistor 600 and the heat generating resistor 500 disposed in the segment SE in which the temperature measuring resistor 600 is disposed are projected onto an arbitrary virtual plane parallel to the Z axis direction, the positions of opposite ends of the projection of the temperature measuring resistor 600 are located between opposite ends of the projection of the heat generating resistor 500, as viewed in a direction parallel to the virtual plane and orthogonal to the Z axis direction. The above feature means that, when viewed in the Z axis direction, the temperature measuring resistor 600 is disposed more inward in the segment SE in which the temperature measuring resistor 600 is disposed (i.e., located farther apart from the boundary of the segment SE) as compared with the heat generating resistor 500 disposed in the segment SE in which the temperature measuring resistor 600 is disposed.

As shown in FIG. 4, in the electrostatic chuck 100 of the present embodiment, the line widths of the conductive lines (the first conductive lines 711 and the second conductive lines 712) included in the temperature measuring resistor driver 70 differ from each other. More specifically, the greater the length L of the conductive line (711, 712), the greater the line width W of the conductive line (711, 712). For example, let the lengths of six conductive lines 711 and 712 included in the temperature measuring resistor driver 70 shown in FIG. 4 be L1, L2, L3, L4, L5, and L6 in order from top to bottom, and their line widths be W1, W2, W3, W4, W5, and W6 in order from top to bottom. Then relations (1) and (2) shown below hold. Therefore, the resistance values of the conductive lines 711 and 712 included in the temperature measuring resistor driver 70 are close to each other. The length L of a conductive line 711 or 712 means its dimension (size) from the center of a via of the conductive line 711 or 712 for connection to one conductive member (e.g., a temperature measuring resistor 600) (when a plurality of vias are present, the centroid of a polygon whose vertices coincide with the center points of the vias) to the center of a via of the conductive line 711 or 712 for connection to another conductive member (e.g., an electrode pad 771) (when a plurality of vias are present, the centroid of a polygon whose vertices coincide with the center points of the vias) in the direction of the extending direction of the conductive line 711 or 712. The width W of a conductive line 711 or 712 means its dimension (size) in a direction orthogonal to the extending direction of the conductive line 711 or 712.

$$L1<L2<L3<L4<L5<L6 \quad (1)$$

$$W1<W2<W3<W4<W5<W6 \quad (2)$$

As shown in FIG. 4, in the electrostatic chuck 100 of the present embodiment, the line widths of the first conductive lines 711 and the second conductive lines 712 of the line pairs 710 included in the temperature measuring resistor driver 70 are larger than the line widths of the temperature measuring resistors 600 electrically connected to the line pairs 710 (specifically, the line widths of resistance wiring portions of the first resistor element 610, the second resistor element 620, and the third resistor element 630 of each temperature measuring resistor 600). For example, in a line pair 710 electrically connected to a temperature measuring resistor 600 disposed in the leftmost one of the three segments SE shown in FIG. 4, the line width W5 of the first conductive line 711 included in this pair and the line width W6 of the second conductive line 712 included in this pair are larger than the line widths of this temperature measuring resistor 600.

The heat generating resistors 500, the temperature measuring resistors 600, the heat generating resistor driver 51, and the temperature measuring resistor driver 70 differ in at least one of the following respects.

(1) Specific Resistances (Ω·m) of Materials

The specific resistance of the material of the heat generating resistor driver 51 is 95% or less of the specific resistance of the material of the heat generating resistors 500.

The specific resistance of the material of the temperature measuring resistor driver 70 is 95% or less of the specific resistance of the material of the temperature measuring resistors 600.

(2) Temperature Coefficients of Resistance (ppm/° C.) of Materials

The temperature coefficient of resistance of the material of the temperature measuring resistors 600 is 110% or more of the temperature coefficient of resistance of the material of the heat generating resistors 500.

The temperature coefficient of resistance of the material of the temperature measuring resistors 600 is 110% or more of the temperature coefficient of resistance of the material of the temperature measuring resistor driver 70.

(3) Pattern Shapes

Each heat generating resistor 500 is routed over the entire corresponding segment SE at a constant pitch, and its pattern width is partially adjusted in order to obtain a smooth temperature profile with no temperature singularity. Each heat generating resistor 500 may have a structure including a plurality of elements arranged in the vertical direction and connected in series in order to obtain high resistance.

Each temperature measuring resistor 600 is routed around a point in a corresponding segment SE at which the temperature of the corresponding segment SE is to be measured. At the boundary between adjacent segments SE, their temperatures are influenced by each other. Therefore, each temperature measuring resistor 600 is routed so as to be spaced as far as possible from the boundaries with adjacent segments SE. Since it is unnecessary to adjust the pattern of the temperature measuring resistors 600 in order to avoid temperature singularities, the line width of the temperature measuring resistors 600 is narrower than the line width of the heat generating resistors 500 and is uniform. Each temperature measuring resistor 600 may have a structure including a plurality of elements arranged in the vertical direction and connected in series in order to obtain high resistance.

The heat generating resistor driver 51 is composed of thick wiring lines routed from connection points (vias) for the heat generating resistors 500 to connection points (vias) for the electricity supply terminals along shortest possible routes without turning points. The heat generating resistor driver 51 may have a structure including a plurality of elements arranged in the vertical direction and connected in parallel in order to obtain low resistance. When obstacles are present in the routes from the connection points (vias) for the heat generating resistors 500 to the connection points (vias) for the electricity supply terminals, the heat generating resistor driver 51 may have a structure including a plurality of elements arranged in the vertical direction and connected in series.

The temperature measuring resistor driver 70 is composed of thick wiring lines routed from connection points (vias) for the temperature measuring resistors 600 to connection points (vias) for the electricity supply terminals along shortest possible routes without turning points, as is the heat generating resistor driver 51. The temperature measuring resistor driver 70 may have a structure including a plurality of elements arranged in the vertical direction and connected in parallel in order to obtain low resistance. When obstacles are present in the routes from the connection points (vias) for the temperature measuring resistors 600 to the connection points (vias) for the electricity supply terminals, the temperature measuring resistor driver 70 may have a structure including a plurality of elements arranged in the vertical direction and connected in series.

A-4. Effects of Present Embodiment

As described above, the electrostatic chuck 100 of the first embodiment is a holding device that includes the ceramic plate 10 having the approximately flat attracting surface S1 approximately orthogonal to the Z axis direction and holds an object (e.g., the wafer W) on the attracting surface S1 of the ceramic plate 10. The electrostatic chuck 100 includes the heat generating resistors 500 and the temperature measuring resistors 600 that are disposed in the respective segments SE formed by virtually dividing the ceramic plate 10 and arranged in plane directions and further includes the electricity supply section 80 that forms electricity supply paths for the heat generating resistors 500 and the temperature measuring resistors 600. In each of the segments SE, the Z axis direction position of the temperature measuring resistor 600 differs from the Z axis direction position of the heat generating resistor 500. In the electrostatic chuck 100 of the first embodiment, each temperature measuring resistor 600 includes three resistor elements (the first resistor element 610, the second resistor element 620, and the third resistor element 630) located at different Z axis direction positions and connected in series. Therefore, in the electrostatic chuck 100 of the first embodiment, while each temperature measuring resistor 600 is disposed within a corresponding segment SE, the resistance value of this temperature measuring resistor 600 can be higher than that of a temperature measuring resistor 600 having a single layer structure. When the resistance value of the temperature measuring resistor 600 is high, the resolution (sensitivity) of the temperature measurement based on the resistance value of the temperature measuring resistor 600 is improved. Therefore, in the electrostatic chuck 100 of the first embodiment, since the resolution of the temperature measurement based on the resistance values of the temperature measuring resistors 600 is improved, the accuracy of the measurement of the temperatures of the segments SE of the ceramic plate 10 can be improved, and the accuracy in controlling the temperatures of the segments SE using the heat generating resistors 500 disposed in the respective segments SE can be improved. Therefore, the uniformity of the temperature distribution on the attracting surface S1 of the ceramic plate 10 (i.e., the uniformity of the temperature distribution in the wafer W) can be improved.

The electrostatic chuck 100 of the first embodiment further includes the base member 20 disposed so as to face the surface S2 of the ceramic plate 10 that is opposite to its attracting surface S1. The coolant channel 21 is formed inside the base member 20. Each temperature measuring resistor 600 is located closer to the base member 20 than a corresponding heat generating resistor 500 disposed in the segment SE in which the temperature measuring resistor 600 is disposed. As described above, in the electrostatic chuck 100 of the first embodiment, the temperature of the ceramic plate 10 is controlled not only through heating by the heat generating resistors 500 but also through cooling (heat absorption) by the coolant supplied to the coolant channel 21 of the base member 20. In the electrostatic chuck 100 of the first embodiment, since the temperature measuring resistors 600 are disposed between the heat generating resistors 500 for heating and the coolant channel 21 for cooling with respect to the Z axis direction, the accuracy of the measurement of the temperatures of the segments SE using the temperature measuring resistors 600 can be further improved, and therefore the uniformity of the temperature distribution on the attracting surface S1 of the ceramic plate 10 (i.e., the uniformity of the temperature distribution in the wafer W) can be further improved.

In the electrostatic chuck 100 of the first embodiment, the electricity supply section 80 that forms the electricity supply paths for the heat generating resistors 500 and the temperature measuring resistors 600 includes the temperature measuring resistor driver 70, the pair of electricity supply terminals 12, the electricity supply-side via pairs 75, and the resistor-side via pairs 73. The temperature measuring resistor driver 70 includes the line pairs 710 each including the first conductive line 711 and the second conductive line 712. Each electricity supply-side via pair 75 includes: the electricity supply-side via 751 that electrically connects the first conductive line 711 of a corresponding line pair 710 included in the temperature measuring resistor driver 70 to one of the electricity supply terminals 12; and the electricity supply-side via 752 that electrically connects the second conductive line 712 of the corresponding line pair 710 to the other one of the electricity supply terminals 12. Each resistor-side via pair 73 includes: the resistor-side via 731 that electrically connects one end of a corresponding temperature measuring resistor 600 to the first conductive line 711 of a corresponding line pair 710; and the resistor-side via 732 that electrically connects the other end of the corresponding temperature measuring resistor 600 to the second conductive line 712 of the corresponding line pair 710. In the electrostatic chuck 100 of the first embodiment, the line widths of the first conductive lines 711 and the second conductive lines 712 of the line pairs 710 electrically connected to the temperature measuring resistors 600 are larger than the line widths of the temperature measuring resistors 600. Therefore, in the electrostatic chuck 100 of the first embodiment, the resistance values of the conductive lines 711 and 712 of the line pairs 710 included in the temperature measuring resistor driver 70 can be reduced relatively with respect to the resistance value of the temperature measuring resistors 600, and the resistance value of the temperature measuring resistors 600 can be increased relatively with respect to the resistance values of the conductive lines 711 and 712.

The temperature coefficients of resistance of the conductive lines 711 and 712 and the temperature measuring resistors 600 are roughly determined by the types of materials forming them. Only limited materials (materials such as tungsten, molybdenum, and platinum that can be fired together with ceramics) can be used to form the conductive lines 711 and 712 and the temperature measuring resistors 600. Since there are almost no differences between the temperature coefficients of resistance of these materials, it is difficult to relatively increase the resistance values of the temperature measuring resistors 600 through material selection. Therefore, in the present embodiment, the resistance values of the temperature measuring resistors 600 are increased relatively by adjusting the widths of the conductive lines 711 and 712 and the temperature measuring resistors 600. The specific resistance of a material can be increased by mixing an insulator (such as alumina) into the material. Therefore, in addition to the above-described method for relatively increasing the resistance values of the temperature measuring resistors 600, the method in which the specific resistance is changed may also be used.

As described above, in the electrostatic chuck 100 of the first embodiment, since the resistance values of the temperature measuring resistors 600 can be increased relatively, the resolution of the temperature measurement based on the resistance values of the temperature measuring resistors 600 can be improved, and the accuracy of the measurement of the temperatures of the segments SE of the ceramic plate 10 can thereby be improved. Therefore, the uniformity of the temperature distribution on the attracting surface S1 of the ceramic plate 10 (i.e., the uniformity of the temperature distribution in the wafer W) can be improved. Since the temperature measuring resistors 600 are contained within the respective segments SE, the resistance value of each temperature measuring resistor 600 is less susceptible to the temperatures of other segments SE. However, the conductive lines 711 and 712 of each of the line pairs 710 included in the temperature measuring resistor driver 70 extend to the outside of the segment SE in which a corresponding temperature measuring resistor 600 electrically connected to the conductive lines 711 and 712 is contained and are disposed so as to pass through other segments SE (see FIG. 4), and the resistance values of these conductive lines 711 and 712 are influenced by the temperatures of other segments SE. As described above, in the electrostatic chuck 100 of the first embodiment, since the resistance values of the conductive lines 711 and 712 of the line pairs 710 included in the temperature measuring resistor driver 70 can be reduced relatively, the ratio of the resistance value of each line pair 710 (that is influenced by the temperatures of other segments SE) to the resistance value of an electric circuit including a corresponding temperature measuring resistor 600 and this line pair 710 can be reduced. Therefore, in the electrostatic chuck 100 of the first embodiment, the accuracy of the measurement of the temperatures of the segments SE using the temperature measuring resistors 600 can be improved effectively, and the uniformity of the temperature distribution on the attracting surface S1 of the ceramic plate 10 (i.e., the uniformity of the temperature distribution in the wafer W) can be improved effectively.

In the electrostatic chuck 100 of the present embodiment, the conductive lines (the first conductive line 711 and the second conductive line 712) included in the temperature measuring resistor driver 70 are formed such that the greater the length L of the conductive line (711, 712), the greater the width W of the conductive line (711, 712). Therefore, in the electrostatic chuck 100 of the present embodiment, the conductive lines 711 and 712 included in the temperature measuring resistor driver 70 can have close resistance values, and the variation of the ratios of the resistance values of the conductive lines 711 and 712 to the resistance values of electric circuits including the temperature measuring resistors 600 and the conductive lines 711 and 712 can be reduced. Therefore, in the electrostatic chuck 100 of the present embodiment, the accuracy of the measurement of the temperatures of the segments SE using the temperature measuring resistors 600 can be effectively improved, and the uniformity of the temperature distribution on the attracting surface S1 of the ceramic plate 10 (i.e., the uniformity of the temperature distribution in the wafer W) can be effectively improved.

In the electrostatic chuck 100 of the present embodiment, when each temperature measuring resistor 600 and a corresponding heat generating resistor 500 disposed in the segment SE in which the temperature measuring resistor 600 is disposed are projected onto an arbitrary virtual plane VS parallel to the Z axis direction, the positions of opposite ends EP11 and EP12 of the projection 601 of the temperature measuring resistor 600 are located between opposite ends EP21 and EP22 of the projection 501 of the heat generating resistor 500, as viewed in a direction parallel to the virtual plane VS and orthogonal to the Z axis direction. Therefore, in the electrostatic chuck 100 of the present embodiment, when viewed in the Z axis direction, each temperature measuring resistor 600 can be disposed more inward in the segment SE in which the temperature measuring resistor 600 is disposed (i.e., located farther apart from the boundary of the segment SE), as compared with a corresponding heat generating resistor 500 disposed in the segment SE in which the temperature measuring resistor 600 is disposed. Therefore, in the electrostatic chuck 100 of the present embodiment, the temperature (resistance value) of the temperature measuring resistor 600 disposed in a certain segment SE can be prevented from being influenced by the temperatures of other segments SE. Therefore, the accuracy of the measurement of the temperatures of the segments SE using the temperature measuring resistors 600 can be improved, so that the uniformity of the temperature distribution on the attracting surface S1 of the ceramic plate 10 (i.e., the uniformity of the temperature distribution in the wafer W) can be improved.

A-5. Modification of First Embodiment

Figure 7:
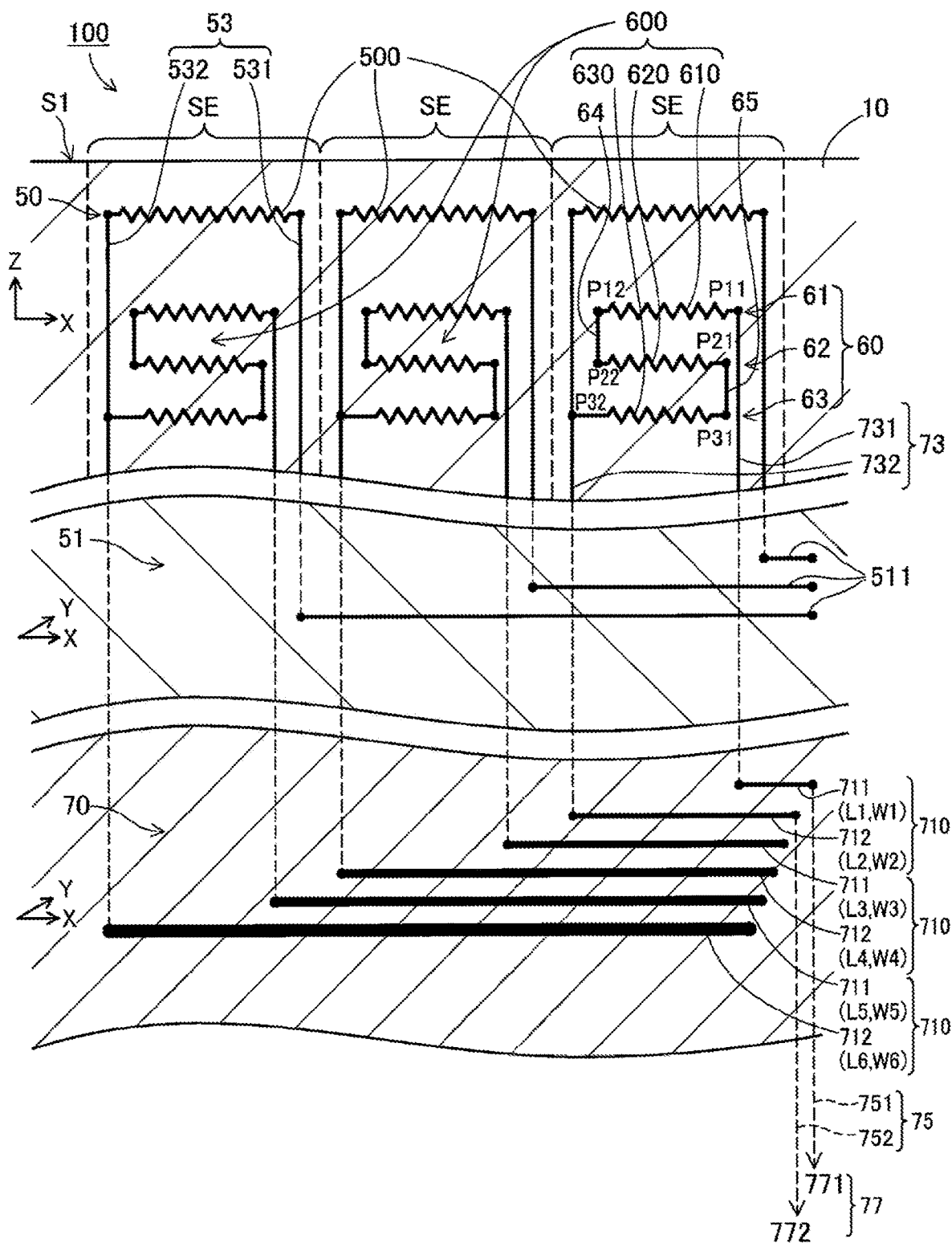
FIG. 7 is an illustration schematically showing structures of the heat generating resistor layer 50, the heat generating resistor driver 51, the temperature measuring resistor layer 60, and the temperature measuring resistor driver 70 of an electrostatic chuck 100 according to a modification of the first embodiment.

FIG. 7 is an illustration schematically showing the structures of the heat generating resistor layer 50, the heat generating resistor driver 51, the temperature measuring resistor layer 60, and the temperature measuring resistor driver 70 of an electrostatic chuck 100 according to a modification of the first embodiment. The structure of the electrostatic chuck 100 of the modification of the first embodiment shown in FIG. 7 differs from the structure of the electrostatic chuck 100 of the first embodiment described above in that one of the two conductive lines connected to a heat generating resistor 500 and one of the two conductive lines connected to a temperature measuring resistor 600 disposed in the segment SE in which the heat generating resistor 500 is disposed share a common conductive line. For example, one end of a heat generating resistor 500 disposed in the rightmost one of three segments SE shown in FIG. 7 is electrically connected to a first conductive line 511 included in the heat generating resistor driver 51, and the other end of this heat generating resistor 500 is electrically connected to a second conductive line 712 of a line pair 710 electrically connected to a temperature measuring resistor 600 disposed in the rightmost segment SE (therefore, a common via is used for a via 532 of a via pair 53 and a resistor-side via 732 of a resistor-side via pair 73). Even in this structure, voltages applied to the heat generating resistors 500 and the temperature measuring resistors 600 can be controlled individually, and the temperatures of the segments SE can be controlled using the heat generating resistors 500 based on the results of the measurement of the temperatures of the segments SE using the temperature measuring resistors 600.

B. Second Embodiment

Figure 8:
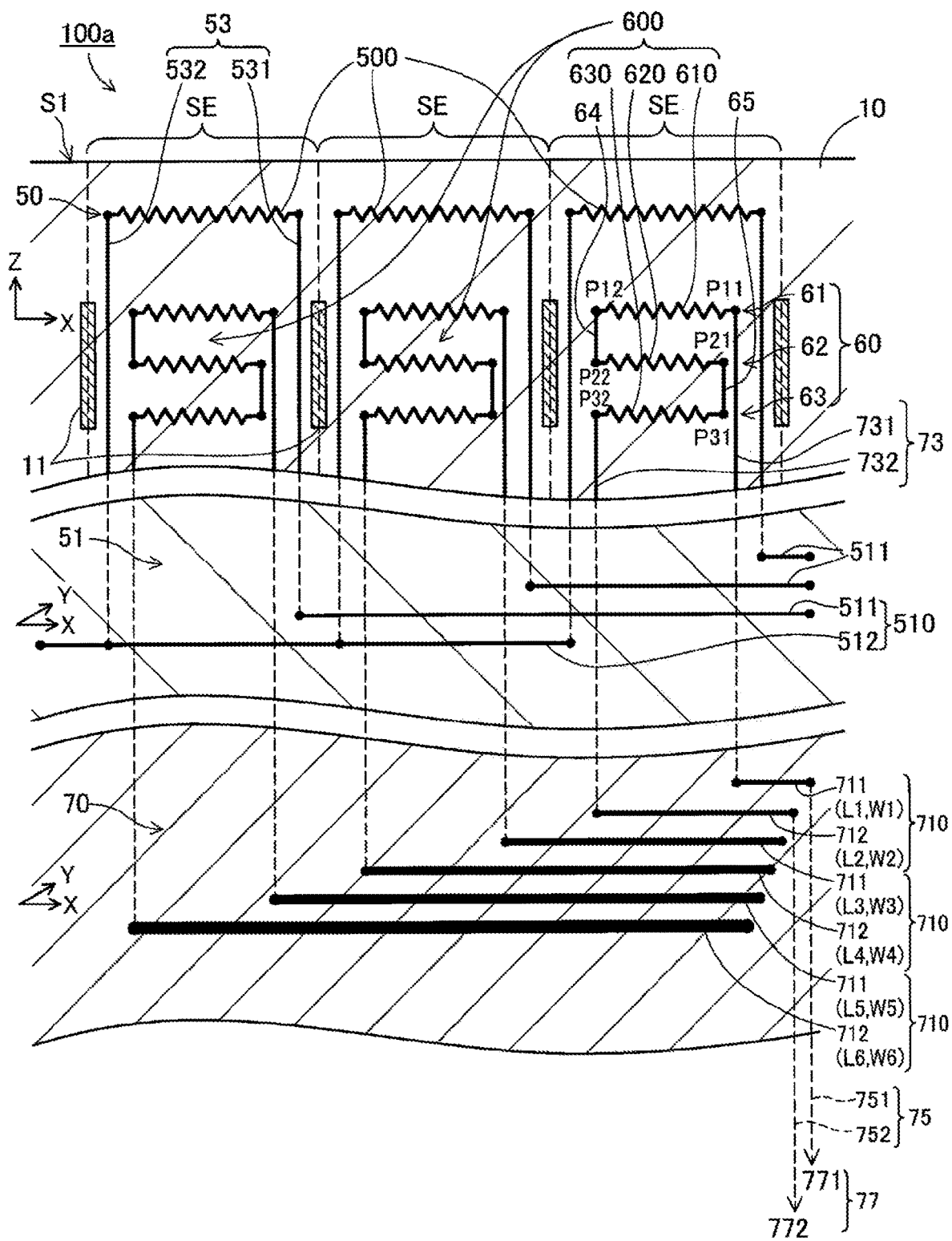
FIG. 8 is an illustration schematically showing structures of the heat generating resistor layer 50, the heat generating resistor driver 51, the temperature measuring resistor layer 60, and the temperature measuring resistor driver 70 of an electrostatic chuck 100a according to a second embodiment.

FIG. 8 is an illustration schematically showing the structures of the heat generating resistor layer 50, the heat generating resistor driver 51, the temperature measuring resistor layer 60, and the temperature measuring resistor driver 70 of an electrostatic chuck 100a according to a second embodiment. In the following description of the electrostatic chuck 100a of the second embodiment, the same components as those of the electrostatic chuck 100 of the first embodiment are denoted by the same numerals, and the description thereof will be appropriately omitted.

As shown in FIG. 8, the structure of the electrostatic chuck 100a of the second embodiment differs from the structure of the electrostatic chuck 100 of the first embodiment described above in that heat insulating layers 11 are disposed between the temperature measuring resistors 600 within the ceramic plate 10. The heat insulating layers 11 are portions having a lower thermal conductivity than the material forming the ceramic plate 10 and are, for example, cavities. Alternatively, the heat insulating layers 11 are formed by filling holes inside the ceramic plate 10 with a material having a lower thermal conductivity than the material forming the ceramic plate 10. As viewed in the Z axis direction, the heat insulating layers 11 are disposed so as to surround the temperature measuring resistors 600 intermittently or continuously. The ceramic plate 10 having the above structure can be produced as follows. For example, in the method of producing the ceramic plate 10 of the first embodiment, holes are formed in the ceramic green sheet at positions corresponding to the heat insulating layers 11. Alternatively, after the formation of the holes, these holes are filled with a material having a lower thermal conductivity.

As described above, in the electrostatic chuck 100a of the second embodiment, the heat insulating layers 11 having a lower thermal conductivity than the ceramic plate 10 are disposed between the temperature measuring resistors 600 within the ceramic plate 10. Therefore, in the electrostatic chuck 100a of the second embodiment, although the temperatures (resistance values) of the temperature measuring resistors 600 disposed in their respective segments SE are influenced by the temperatures of other segments SE, the influence can be effectively reduced. Therefore, in the electrostatic chuck 100a of the second embodiment, the accuracy of the measurement of the temperatures of the segments SE using the temperature measuring resistors 600 can be effectively improved, and the uniformity of the temperature distribution on the attracting surface S1 of the ceramic plate 10 (i.e., the uniformity of the temperature distribution in the wafer W) can be effectively improved.

C. Third Embodiment

Figure 9:
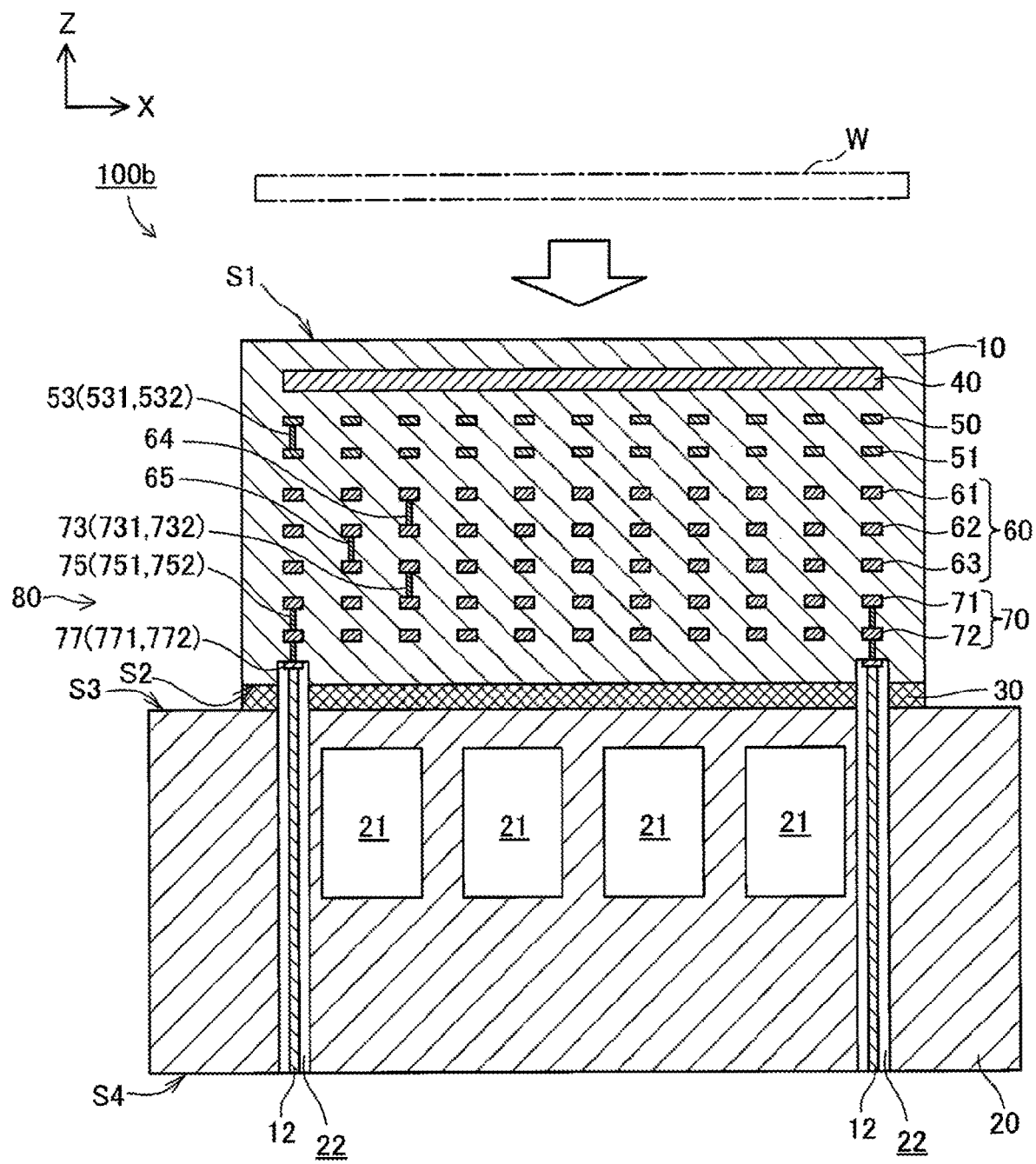
FIG. 9 is an illustration schematically showing an XZ cross-sectional structure of an electrostatic chuck 100b according to a third embodiment.
Figure 10:
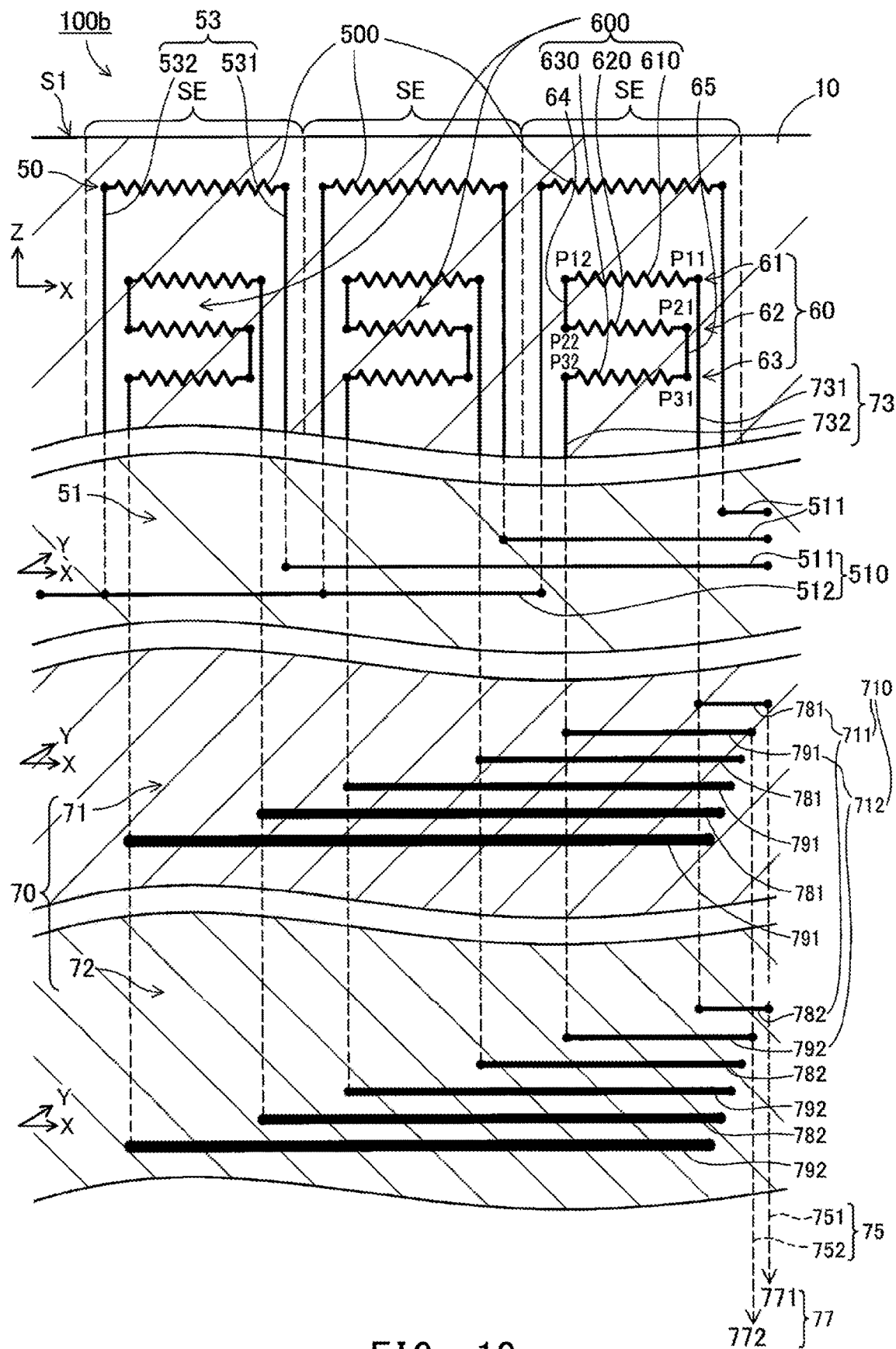
FIG. 10 is an illustration schematically showing structures of the heat generating resistor layer 50, the heat generating resistor driver 51, the temperature measuring resistor layer 60, and the temperature measuring resistor driver 70 of the electrostatic chuck 100b of the third embodiment.

FIG. 9 is an illustration schematically showing an XZ cross-sectional structure of an electrostatic chuck 100b according to a third embodiment, and FIG. 10 is an illustration schematically showing the structures of the heat generating resistor layer 50, the heat generating resistor driver 51, the temperature measuring resistor layer 60, and the temperature measuring resistor driver 70 of the electrostatic chuck 100b of the third embodiment. In the following description of the structure of the electrostatic chuck 100b of the third embodiment, the same components as those of the electrostatic chuck 100 of the first embodiment are denoted by the same numerals, and the description thereof will be appropriately omitted.

As shown in FIG. 9, the structure of the electrostatic chuck 100b of the third embodiment differs from the structure of the electrostatic chuck 100 of the first embodiment described above in that the temperature measuring resistor driver 70 has a two-layer structure including a first temperature measuring resistor driver layer 71 and a second temperature measuring resistor driver layer 72.

As shown in FIG. 10, in the temperature measuring resistor driver 70 of the electrostatic chuck 100h of the third embodiment, the first conductive line 711 of each line pair 710 electrically connected to a corresponding temperature measuring resistor 600 includes: a first conductive line element 781 included in the first temperature measuring resistor driver layer 71; and a second conductive line element 782 included in the second temperature measuring resistor driver layer 72. The Z axis direction positions of the first conductive line element 781 and the second conductive line element 782 differ from each other, and they are connected in parallel to each other.

Similarly, in the temperature measuring resistor driver 70 of the electrostatic chuck 100b of the third embodiment, the second conductive line 712 of each line pair 710 electrically connected to a corresponding temperature measuring resistor 600 includes: a first conductive line element 791 included in the first temperature measuring resistor driver layer 71; and a second conductive line element 792 included in the second temperature measuring resistor driver layer 72. The Z axis direction positions of the first conductive line element 791 and the second conductive line element 792 differ from each other, and they are connected in parallel to each other.

As described above, in the electrostatic chuck 100b of the third embodiment, the first conductive line 711 and the second conductive line 712 of each line pair 710 electrically connected to a corresponding temperature measuring resistor 600 each include two conductive line elements located at different Z axis direction positions and connected in parallel to each other (the first and second conductive line elements 781 and 782 and the first and second conductive line elements 791 and 792, respectively). Therefore, in the electrostatic chuck 100b of the third embodiment, the resistance values of the conductive lines 711 and 712 of the line pairs 710 included in the temperature measuring resistor driver 70 can be reduced relatively with respect to the resistance values of the temperature measuring resistors 600, and the resistance values of the temperature measuring resistors 600 can be increased relatively with respect to the resistance values of the conductive lines 711 and 712. In the electrostatic chuck 100b of the third embodiment, since the resolution of the temperature measurement based on the resistance values of the temperature measuring resistors 600 can be improved, the accuracy of the measurement of the temperatures of the segments SE of the ceramic plate 10 can be improved, so that the uniformity of the temperature distribution on the attracting surface S1 of the ceramic plate 10 (i.e., the uniformity of the temperature distribution in the wafer W) can be improved. In the electrostatic chuck 100b of the third embodiment, since the resistance values of the conductive lines 711 and 712 of the line pairs 710 included in the temperature measuring resistor driver 70 can be reduced relatively, the ratio of the resistance value of each line pair 710 (that is influenced by the temperatures of other segments SE) to the resistance value of an electric circuit including a corresponding temperature measuring resistor 600 and this line pair 710 can be reduced. Therefore, in the electrostatic chuck 100b of the third embodiment, the accuracy of the measurement of the temperatures of the segments SE using the temperature measuring resistors 600 can be effectively improved, and therefore the uniformity of the temperature distribution on the attracting surface S1 of the ceramic plate 10 (i.e., the uniformity of the temperature distribution in the wafer W) can be improved effectively.

D. Fourth Embodiment

Figure 11:
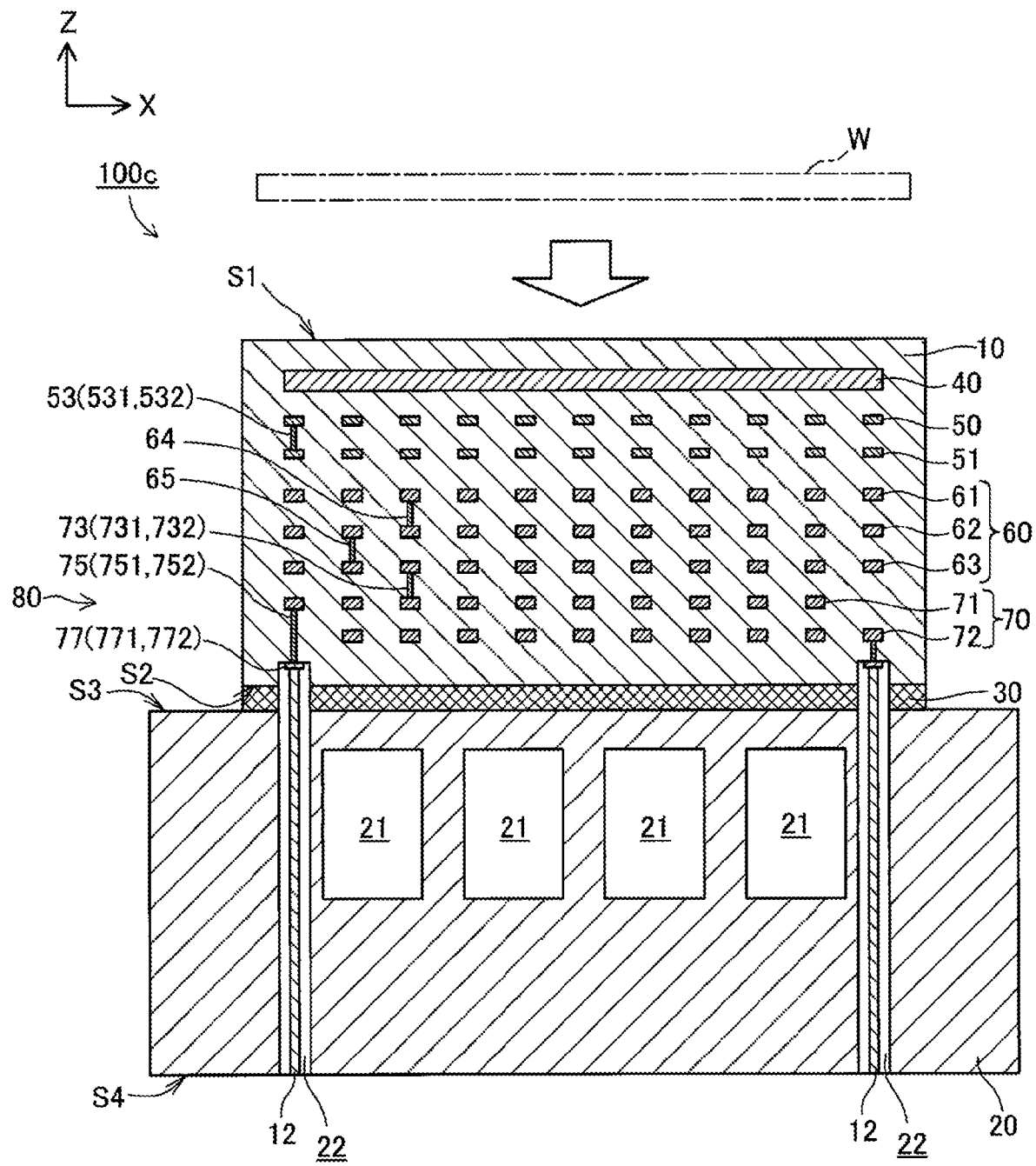
FIG. 11 is an illustration schematically showing an XZ cross-sectional structure of an electrostatic chuck 100c according to a fourth embodiment.
Figure 12:
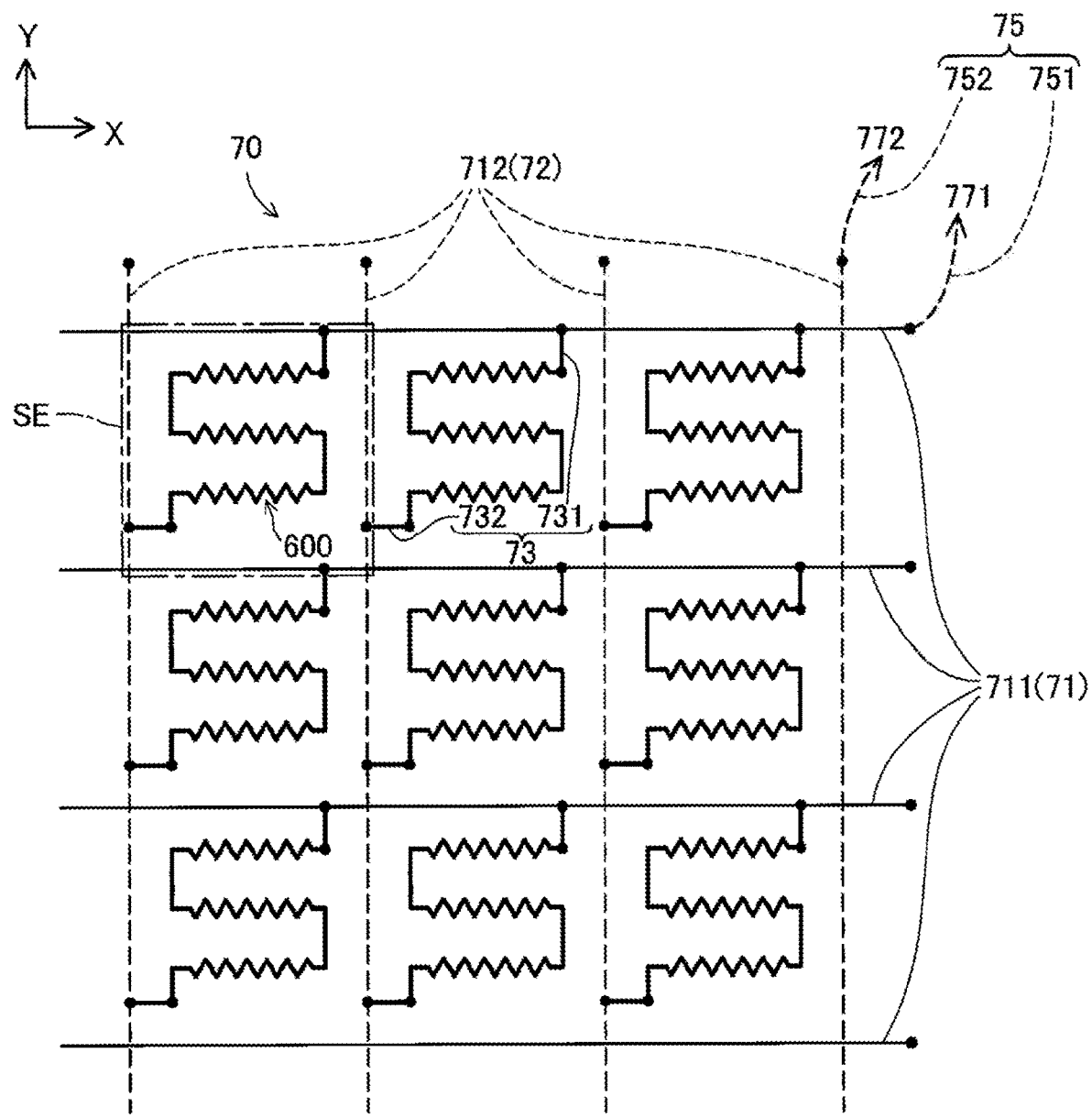
FIG. 12 is an illustration schematically showing an XY plane structure of the temperature measuring resistor driver 70 of the electrostatic chuck 100c according to the fourth embodiment.

FIG. 11 is an illustration schematically showing an XZ cross-sectional structure of an electrostatic chuck 100c according to a fourth embodiment, and FIG. 12 is an illustration schematically showing an XY plane structure of the temperature measuring resistor driver 70 of the electrostatic chuck 100c of the fourth embodiment. In the following description of the electrostatic chuck 100c of the fourth embodiment, the same components as those of the electrostatic chuck 100 of the first embodiment are denoted by the same numerals, and the description thereof will be appropriately omitted.

As shown in FIG. 11, the structure of the electrostatic chuck 100c of the fourth embodiment differs from the structure of the electrostatic chuck 100 of the first embodiment described above in that the temperature measuring resistor driver 70 has a two-layer structure including a first temperature measuring resistor driver layer 71 and a second temperature measuring resistor driver layer 72.

As shown in FIG. 12, in the electrostatic chuck 100c of the fourth embodiment, the temperature measuring resistor driver 70 is a so-called crosslink-type driver. Specifically, the temperature measuring resistor driver 70 includes a plurality of first conductive lines 711 and a plurality of second conductive lines 712. In the present embodiment, the first conductive lines 711 are disposed so as to extend approximately parallel to the X axis direction, and the second conductive lines 712 are disposed so as to extend approximately parallel to the Y axis direction. The plurality of first conductive lines 711 are included in the first temperature measuring resistor driver layer 71, and the plurality of second conductive lines 712 are included in the second temperature measuring resistor driver layer 72. In FIG. 12, both the first conductive lines 711 and the second conductive line 712 are shown for convenience of illustration. However, in actuality, the Z axis direction position of the first conductive line 711 and the Z axis direction position of the second conductive line 712 differ from each other.

Each first conductive line 711 is electrically connected to one of the electricity supply terminals 12 through the electricity supply-side via 751 of a corresponding electricity supply-side via pair 75 and the electrode pad 771 of an electrode pad pair 77 (FIG. 11), and each second conductive line 712 is electrically connected to the other one of the electricity supply terminals 12 through the electricity supply-side via 752 of a corresponding electricity supply-side via pair 75 and the electrode pad 772 of the electrode pad pair 77. In FIG. 12, only one electricity supply-side via pair 75 for one first conductive line 711 and one second conductive line 712 is shown as a representative pair, and the illustrations of electricity supply-side via pairs 75 for other conductive lines 711 and 712 are omitted. The electricity supply-side via 751 corresponds to the first electricity supply-side via in the claims, and the electricity supply-side via 752 corresponds to the second electricity supply-side via in the claims.

Each temperature measuring resistor 600 disposed in a corresponding one of the segments SE of the ceramic plate 10 is electrically connected to one of the first conductive lines 711 through the resistor-side via 731 of a corresponding resistor-side via pair 73 and is also electrically connected to one of the second conductive lines 712 through the resistor-side via 732 of the corresponding resistor-side via pair 73. Each first conductive line 711 is electrically connected to a plurality of temperature measuring resistors 600, and each second conductive line 712 is electrically connected to a plurality of temperature measuring resistors 600. In this case, the temperature measuring resistors 600 differ from one another in terms of the combination of the first conductive line 711 and the second conductive line 712 electrically connected to each of the temperature measuring resistors 600. For example, among nine temperature measuring resistors 600 shown in FIG. 12, the upper-left temperature measuring resistor 600 is connected to a combination of the upper most one of the four first conductive lines 711 shown in FIG. 12 and the leftmost one of the four second conductive lines 712. Among the nine temperature measuring resistors 600 shown in FIG. 12, the upper right temperature measuring resistor 600 is connected to a combination of the uppermost one of the four first conductive lines 711 and one of the four second conductive lines 712 that is located third from the left. The resistor-side via 731 corresponds to the first resistor-side via in the claims, and the resistor-side via 732 corresponds to the second resistor-side via in the claims.

In the electrostatic chuck 100c of the fourth embodiment, the temperature measuring resistors 600 disposed in the respective segments SE of the ceramic plate 10 are selected one by one, and a voltage from a power source (not shown) is applied to the selected temperature measuring resistor 600 through the pair of electricity supply terminals 12, the electrode pad pair 77, a corresponding electricity supply-side via pair 75, and corresponding conductive lines 711 and 712. Namely, the sequentially selected one of the plurality of first conductive lines 711 included in the temperature measuring resistor driver 70 is turned ON (conducting), and the sequentially selected one of the plurality of second conductive lines 712 included in the temperature measuring resistor driver 70 is turned ON (conducting). Then a voltage is applied from the power source to a temperature measuring resistor 600 connected to the combination of the turned-ON first conductive line 711 and the turned-ON second conductive line 712. Then a current flows into this temperature measuring resistor 600, and the temperature of the temperature measuring resistor 600 (the temperature of the segment SE in which the temperature measuring resistor 600 is disposed) is measured based on the voltage applied to the temperature measuring resistor 600 and the current flowing through the temperature measuring resistor 600. By repeating the selection of one from the first conductive lines 711 and the selection of one from the second conductive lines 712, a voltage is applied sequentially to the temperature measuring resistors 600 disposed in the respective segments SE of the ceramic plate 10, and the temperatures of the segments SE of the ceramic plate 10 are measured sequentially. Therefore, in the electrostatic chuck 100c of the present embodiment, the temperatures of the segments SE in the ceramic plate 10 can be controlled individually by individually controlling the voltage applied to the heat generating resistors 500 disposed in the respective segments SE based on the results of measurement of the temperatures of the segments SE. Therefore, the uniformity of the temperature distribution on the attracting surface S1 of the ceramic plate 10 (i.e., the uniformity of the temperature distribution in the wafer W) can be improved.

As described above, in the electrostatic chuck 100c of the fourth embodiment, the electricity supply section 80 includes: the temperature measuring resistor driver 70, the pair of electricity supply terminals 12, the electricity supply-side via pairs 75, and the resistor-side via pairs 73. The temperature measuring resistor driver 70 includes the plurality of first conductive lines 711 and the plurality of second conductive lines 712. Each of the electricity supply-side via pairs 75 includes: the first electricity supply-side via 751 that electrically connects a corresponding one of the plurality of first conductive lines 711 to one of the pair of electricity supply terminals 12; and the second electricity supply-side via 752 that electrically connects a corresponding one of the plurality of second conductive lines 712 to the other one of the pair of electricity supply terminals 12. Each resistor-side via pair 73 electrically connects a corresponding temperature measuring resistor 600 to a corresponding first conductive line 711 and a corresponding second conductive line 712. The temperature measuring resistors 600 are different from one another in terms of the combination of the first conductive line 711 and the second conductive line 712 electrically connected thereto. As described above, in the electrostatic chuck 100c of the fourth embodiment, the temperature measuring resistor driver 70 used is a so-called crosslink-type driver. Therefore, in the electrostatic chuck 100c of the fourth embodiment, the individual electricity supply paths to the temperature measuring resistors 600 can be formed using a relatively small number of conductive lines 711 and 712. Therefore, by making the line widths of the conductive lines 711 and 712 relatively large, the resistance values of the conductive lines 711 and 712 included in the temperature measuring resistor driver 70 can be reduced relatively with respect to the resistance values of the temperature measuring resistors 600, and the resistance values of the temperature measuring resistors 600 can be increased relatively with respect to the resistance values of the conductive lines 711 and 712. Therefore, in the electrostatic chuck 100c of the fourth embodiment, since the resolution of the temperature measurement based on the resistance values of the temperature measuring resistors 600 can be improved, the accuracy of the measurement of the temperatures of the segments SE of the ceramic plate 10 can be improved, and therefore the uniformity of the temperature distribution on the attracting surface S1 of the ceramic plate 10 (i.e., the uniformity of the temperature distribution in the wafer W) can be improved. In the electrostatic chuck 100c of the fourth embodiment, since the resistance values of the conductive lines 711 and 712 of the line pairs 710 included in the temperature measuring resistor driver 70 can be reduced relatively, the ratio of the resistance value of each line pair 710 (that is influenced by the temperatures of other segments SE) to the resistance value of an electric circuit including a corresponding temperature measuring resistor 600 and the line pair 710 can be reduced. Therefore, in the electrostatic chuck 100c of the fourth embodiment, the accuracy of the measurement of the temperatures of the segments SE using the temperature measuring resistors 600 can be effectively improved, and the uniformity of the temperature distribution on the attracting surface S1 of the ceramic plate 10 (i.e., the uniformity of the temperature distribution in the wafer W) can be effectively improved.

E. Other Modifications

The technique disclosed in the present description is not limited to the embodiments described above and may be modified into various forms without departing from the scope of the invention. For example, the following modifications are possible.

The structures of the electrostatic chucks 100 of the above embodiments are merely examples and can be modified variously. For example, in the above embodiments, each temperature measuring resistor 600 includes three resistor elements (the first resistor element 610, the second resistor element 620, and the third resistor element 630) located at different Z axis direction positions and connected in series. However, each temperature measuring resistor 600 may include two or four or more resistor elements located at different Z axis direction positions and connected in series. In this structure also, since the resistance values of the temperature measuring resistors 600 can be increased, the resolution of the temperature measurement based on the resistance values of the temperature measuring resistors 600 can be improved, and the accuracy of the measurement of the temperatures of the segments SE of the ceramic plate 10 using the temperature measuring resistors 600 can be improved. It is not always necessary that all the temperature measuring resistors 600 be composed of resistor elements in a plurality of layers, and part of the temperature measuring resistors 600 may be composed of a resistor element in a single layer.

In the above embodiments, the line widths of the first conductive lines 711 and the second conductive lines 712 of the line pairs 710 included in the temperature measuring resistor driver 70 are larger than the line width of the temperature measuring resistors 600 electrically connected to the line pairs 710. However, only one of the line width of the first conductive lines and the line width of the second conductive lines may be larger than the line width of the temperature measuring resistors 600. In this structure also, since the resistance values of the temperature measuring resistors 600 can be increased relatively, the resolution of the temperature measurement based on the resistance values of the temperature measuring resistors 600 can be improved, and the accuracy of the measurement of the temperatures of the segments SE of the ceramic plate 10 by the temperature measuring resistors 600 can be improved. Moreover, since the resistance values of conductive lines (the first conductive lines 711 or the second conductive lines 712) can be reduced relatively, the ratio of the resistance value of each line pair 710 to the resistance value of an electric circuit including a corresponding temperature measuring resistor 600 and the each line pair 710 can be reduced, and the accuracy of the measurement of the temperatures of the segments SE using the temperature measuring resistors 600 can be effectively improved. It is not always necessary that the line widths of the first conductive lines 711 and/or the second conductive lines 712 of the line pairs 710 included in the temperature measuring resistor driver 70 be larger than the line width of the temperature measuring resistors 600 electrically connected to the line pairs 710. The line widths of the first conductive lines 711 and the second conductive lines 712 may be equal to or less than the line width of the temperature measuring resistors 600.

In the above embodiments, the temperature measuring resistor driver 70 is configured such that the greater the length L of the conductive line (711, 712), the greater the line width W of the conductive line (711, 712). However, it is unnecessary that the above relation hold for all the conductive lines 711 and 712 included in the temperature measuring resistor driver 70, and it is only necessary that the relation hold for at least two conductive lines 711 and 712. Specifically, it is only necessary that the temperature measuring resistor driver 70 include a conductive line (711, 712) having a length L1 in the extending direction and a line width W1 and a conductive line (711, 712) having a length L2 (L2>L1) in the extending direction and a line width W2 (W2>W1). In this structure also, since the at least two conductive lines 711 and 712 can have close resistance values, variations in the resistance values of the conductive lines 711 and 712 can be reduced, and the accuracy of the measurement of the temperatures of the segments SE using the temperature measuring resistors 600 can be effectively improved. It is not always necessary that the temperature measuring resistor driver 70 include a conductive line having a length L1 and a line width W1 and a conductive line having a length L2 (L2>L1) and a line width W2 (W2>W1). For example, the line widths of all the conductive lines 711 and 712 included in the temperature measuring resistor driver 70 may be approximately the same.

In the above embodiments, when each temperature measuring resistor 600 and a corresponding heat generating resistor 500 disposed in the segment SE in which the temperature measuring resistor 600 is disposed are projected onto a virtual plane VS parallel to the Z axis direction, the opposite ends EP11 and EP12 of the projection 601 of the temperature measuring resistor 600 are located between the opposite ends EP21 and EP22 of the projection 501 of the heat generating resistor 500 with respect to a direction parallel to the virtual plane VS and orthogonal to the Z axis direction. However, the temperature measuring resistors 600 and the heat generating resistors 500 are not necessarily configured as described above.

In the third embodiment, in each line pair 710 electrically connected to a corresponding temperature measuring resistor 600, the first conductive line 711 and the second conductive line 712 each include two conductive line elements located at different Z axis direction positions and connected in parallel to each other (the first and second conductive line elements 781 and 782 and the first and second conductive line elements 791 and 792, respectively). However, the first conductive line 711 and the second conductive line 712 may each include three or more conductive line elements located at different Z axis direction positions and connected in parallel to each other. Only one of the first conductive line 711 and the second conductive line 712 may include two (or three or more) conductive line elements disposed at different Z axis direction positions and connected in parallel to each other. In this structure also, since the resistance values of the temperature measuring resistors 600 can be increased relatively, the resolution of the temperature measurement based on the resistance values of the temperature measuring resistors 600 can be improved, and the accuracy of the measurement of the temperatures of the segments SE of the ceramic plate 10 by the temperature measuring resistors 600 can be improved. Moreover, since the resistance values of the conductive lines 711 and 712 can be reduced relatively, the ratio of the resistance value of each line pair 710 to the resistance value of an electric circuit including a corresponding temperature measuring resistor 600 and this line pair 710 can be reduced, and the accuracy of the measurement of the temperatures of the segments SE using the temperature measuring resistors 600 can be effectively improved. It is not always necessary that, in each line pair 710 electrically connected to a corresponding temperature measuring resistor 600, the first conductive line 711 and/or the second conductive line 712 have two (or three or more) conductive line elements disposed at different Z axis direction positions and connected in parallel to each other.

In the above embodiments, as for the Z axis direction positions of the conductive members disposed inside the electrostatic chuck 100, the chuck electrode 40, the heat generating resistor layer 50, the heat generating resistor driver 51, the temperature measuring resistor layer 60, and the temperature measuring resistor driver 70 are disposed in this order from the upper side (the side closer to the attracting surface S1). However, the positional relation between at least two of these conductive members may be reversed. For example, in the above embodiments, the temperature measuring resistor layer 60 is located below the heat generating resistor layer 50 (therefore, the temperature measuring resistors 600 are located below the respective heat generating resistors 500 in the respective segments SE). However, the temperature measuring resistor layer 60 may be located above the heat generating resistor layer 50 (therefore, the temperature measuring resistors 600 may be located above the respective heat generating resistors 500 in the respective segments SE). The heat generating resistor layer 50 etc. may not be disposed inside the ceramic plate 10 but may be disposed on the surface thereof.

In the above embodiments, each of the temperature measuring resistors 600 is electrically connected to the pair of electricity supply terminals 12 through the temperature measuring resistor driver 70. However, each of the temperature measuring resistors 600 may be electrically connected to the pair of electricity supply terminals 12 with no temperature measuring resistor driver 70 therebetween. The electrostatic chuck 100 may include a plurality of temperature measuring resistor drivers 70. In this case, some of the plurality of temperature measuring resistors 600 disposed in the electrostatic chuck 100 may be electrically connected to one of the plurality of temperature measuring resistor drivers 70, and some of the plurality of temperature measuring resistors 600 may be electrically connected to another one of the plurality of temperature measuring resistor drivers 70.

In the above embodiments, part of the structure for supplying electricity to the temperature measuring resistors 600 (e.g., the electricity supply terminals, the vias, the conductive lines, etc.) may be used also for supplying electricity to the heat generating resistors 500. Moreover, part of the structure for supplying electricity to the heat generating resistors 500 (e.g., the electricity supply terminal, the vias, the conductive lines, etc.) may be used also for supplying electricity to the temperature measuring resistors 600. In the above embodiments, each via may be formed from a single via or may include a group of vias.

The arrangement of the segments SE in the above embodiments may be changed freely. For example, in the above embodiments, the plurality of segments SE are disposed so as to be arranged in the circumferential direction of the attracting surface S1. However, the plurality of segments SE may be disposed so as to be arranged in a lattice pattern. For example, in the above embodiments, the entire electrostatic chuck 100 is virtually divided into a plurality of segments SE. However, a part of the electrostatic chuck 100 may be virtually divided into a plurality of segments SE.

It is unnecessary that all the temperature measuring resistors 600 included in the electrostatic chuck 100 have the above-described structure (features) for the temperature measuring resistors 600, and it is only necessary that at least one temperature measuring resistor 600 have the structure. Among the temperature measuring resistors 600 included in the electrostatic chuck 100, any temperature measuring resistor 600 having the above-described structure (features) for the temperature measuring resistors 600 corresponds to the specific temperature measuring resistor in the claims.

In the above embodiments, a single-pole type is used in which one chuck electrode 40 is disposed inside the ceramic plate 10, but a double-pole type may be used in which a pair of chuck electrodes 40 are disposed inside the ceramic plate 10. The materials forming the members of the electrostatic chuck 100 in the above embodiments are merely examples, and these members may be formed from other materials. For example, in the above embodiments, the electrostatic chuck 100 includes the plate-shaped ceramic plate 10. However, the electrostatic chuck 100 (or other holding devices described later) may include a plate-shaped member formed of a different material (e.g., a resin) instead of the ceramic plate 10.

The present invention is not limited to the electrostatic chuck 100 that uses electrostatic attraction to hold the wafer W and is applicable to other holding devices (such as heaters such as CVD heaters and vacuum chucks) for holding an object on the surface of a ceramic plate. When the present invention is applied to a heater, it is preferable that the specific temperature measuring resistor 600 is disposed below a corresponding heat generating resistor 500 disposed in a segment SE in which the specific temperature measuring resistor 600 is disposed (i.e., disposed on a side close to a surface from which electricity supply terminals are drawn). This is because wiring lines from the electricity supply terminals to the temperature measuring resistor 600 do not pass through the heat generating resistor layer 50 (the heat generating resistors 500) in the Z axis direction, and an increase in design constraints on the heat generating resistor layer 50 (the heat generating resistors 500) can be avoided.

DESCRIPTION OF REFERENCE NUMERALS

10: ceramic plate 11: heat insulating layer 12: electricity supply terminal 20: base member 21: coolant channel 22: terminal hole 30: bonding layer 40: chuck electrode 50: heat generating resistor layer 51: heat generating resistor driver 53: via pair 60: temperature measuring resistor layer 61: first resistor layer 62: second resistor layer 63: third resistor layer 64: via 65: via 70: temperature measuring resistor driver 71: first temperature measuring resistor driver layer 72: second temperature measuring resistor driver layer 73: resistor-side via pair 75: pair of electricity supply-side via 77: pair of electrode pads 80: electricity supply section 100: electrostatic chuck 500: heat generating resistor 501: projection 502: resistance wiring portion 504: pad 510: line pair 511: first conductive line 512: second conductive line 531: via 532: via 600: temperature measuring resistor 601: projection 610: first resistor element 612: resistance wiring portion 614: pad 620: second resistor element 630: third resistor element 710: line pair 711: first conductive line 712: second conductive line 731: resistor-side via 732: resistor-side via 751: electricity supply-side via 752: electricity supply-side via 771: electrode pad 772: electrode pad 781: first conductive line element 782: second conductive line element 791: first conductive line element 792: second conductive line element

The invention claimed is:

1. A holding device comprising:
    a plate-shaped member having a first surface approximately orthogonal to a first direction;
    heat generating resistors disposed in respective segments formed by virtually dividing at least part of the plate-shaped member, the segments being arranged in a direction orthogonal to the first direction;
    temperature measuring resistors disposed in the respective segments and located at a position in the first direction different from that of the heat generating resistors; and
    an electricity supply section that forms electricity supply paths for the heat generating resistors and the temperature measuring resistors,
    the holding device being adapted to hold an object on the first surface of the plate-shaped member,
    wherein a specific temperature measuring resistor that is at least one of the temperature measuring resistors includes a plurality of resistor elements disposed at different positions in the first direction and connected to one another in series, and
    each of the plurality of resistor elements of the specific temperature measuring resistor extends in the direction orthogonal to the first direction.

2. The holding device according to claim 1, wherein the electricity supply section includes:
    a driver including a line pair composed of a first conductive line and a second conductive line;
    a pair of electricity supply terminals;
    an electricity supply-side via pair including a first electricity supply-side via and a second electricity supply-side via, the first electricity supply-side via electrically connecting the first conductive line of the line pair to one of the electricity supply terminals, the second electricity supply-side via electrically connecting the second conductive line of the line pair to the other of the electricity supply terminals; and
    a resistor-side via pair including a first resistor-side via and a second resistor-side via, the first resistor-side via electrically connecting one end of one of the temperature measuring resistors to the first conductive line of the line pair, the second resistor-side via electrically connecting the other end of the one of the temperature measuring resistors to the second conductive line of the line pair,
    wherein at least one of the first conductive line and the second conductive line of the line pair that is electrically connected to the specific temperature measuring resistor includes a plurality of conductive line elements disposed at different positions in the first direction and connected in parallel to each other.

3. The holding device according to claim 1, wherein the electricity supply section includes:
    a driver including a plurality of first conductive lines and a plurality of second conductive lines;
    at least one pair of electricity supply terminals;
    an electricity supply-side via pair including a first electricity supply-side via and a second electricity supply-side via, the first electricity supply-side via electrically connecting the plurality of first conductive lines to one of the pair of electricity supply terminals, the second electricity supply-side via electrically connecting the plurality of second conductive lines to the other of the pair of electricity supply terminals; and
    resistor-side via pairs that electrically connect the respective temperature measuring resistors to the respective first conductive lines and the respective second conductive lines,
    wherein each of the first conductive lines is electrically connected to some of the plurality of temperature measuring resistors, and each of the second conductive lines is electrically connected to some of the plurality of temperature measuring resistors, and wherein the temperature measuring resistors differ from one another in terms of a combination of the first conductive line and the second conductive line electrically connected to each of the temperature measuring resistor.

4. The holding device according to claim 1, further comprising a base member that includes a coolant channel formed therein and is disposed on a surface of the plate-shaped member that is opposite to the first surface, wherein the specific temperature measuring resistor is disposed at a position closer to the base member than a corresponding heat generating resistor that is disposed in a segment in which the specific temperature measuring resistor is disposed.

5. The holding device according to claim 1, wherein the electricity supply section includes:

a driver including a line pair composed of a first conductive line and a second conductive line;

a pair of electricity supply terminals;

an electricity supply-side via pair including a first electricity supply-side via and a second electricity supply-side via, the first electricity supply-side via electrically connecting the first conductive line of the line pair to one of the electricity supply terminals, the second electricity supply-side via electrically connecting the second conductive line of the line pair to the other of the electricity supply terminals; and a resistor-side via pair including a first resistor-side via and a second resistor-side via, the first resistor-side via electrically connecting one end of one of the temperature measuring resistors to the first conductive line of the line pair, the second resistor-side via electrically connecting the other end of the one of the temperature measuring resistors to the second conductive line of the line pair, wherein at least one of the first conductive line and the second conductive line of the line pair electrically connected to the specific temperature measuring resistor has a line width larger than that of the specific temperature measuring resistor.

6. The holding device according to claim 5, wherein the conductive lines included in the driver include:

a conductive line having a length $L1$ in an extending direction and a line width $W1$; and a conductive line having a length $L2$ ($L2>L1$) in the extending direction and a line width $W2$ ($W2>W1$).

7. The holding device according to claim 1, wherein, when the specific temperature measuring resistor and a corresponding heat generating resistor disposed in a segment in which the specific temperature measuring resistor is disposed are projected onto an arbitrary virtual plane parallel to the first direction, positions of opposite ends of the projection of the specific temperature measuring resistor are located between opposite ends of the projection of the heat generating resistor, as viewed in a second direction parallel to the virtual plane and orthogonal to the first direction.

8. The holding device according to claim 7, wherein a heat insulating layer having a lower thermal conductivity than the plate-shaped member is disposed within the plate-shaped member to be located between the specific temperature measuring resistor and others of the temperature measuring resistors.

* * * * *